(12) United States Patent
Von Känel et al.

(10) Patent No.: US 8,237,126 B2
(45) Date of Patent: Aug. 7, 2012

(54) X-RAY IMAGING DEVICE AND METHOD FOR THE MANUFACTURING THEREOF

(75) Inventors: Hans Von Känel, Wallisellen (CH); Rolf Kaufmann, Zurich (CH)

(73) Assignees: CSEM Centre Suisse d'Electronique et de Mictrotechnique SA, Neuchatel (CH); Epispeed, Zurich (CH)

( * ) Notice: Subject to any disclaimer, the term of this patent is extended or adjusted under 35 U.S.C. 154(b) by 907 days.

(21) Appl. No.: 12/193,011

(22) Filed: Aug. 17, 2008

(65) Prior Publication Data

US 2009/0045346 A1   Feb. 19, 2009

Related U.S. Application Data

(60) Provisional application No. 60/956,391, filed on Aug. 17, 2007.

(51) Int. Cl.
  *H01L 27/146* (2006.01)
  *H01L 27/14* (2006.01)
  *H01L 31/062* (2012.01)
(52) U.S. Cl. ............ 250/370.09; 250/338.4; 257/291
(58) Field of Classification Search ......... 250/370.09, 250/370.11, 370.14, 338.4; 257/291, 292, 257/294, E31.122, E31.079
See application file for complete search history.

(56) References Cited

U.S. PATENT DOCUMENTS

| | | | |
|---|---|---|---|
| 5,221,413 A | 6/1993 | Brasen et al. | |
| 5,379,336 A | 1/1995 | Kramer et al. | |
| 5,712,484 A | 1/1998 | Harada et al. | |
| 6,537,370 B1 | 3/2003 | Hernandez et al. | |
| 6,642,534 B2 | 11/2003 | Shima et al. | |
| 6,933,503 B2 * | 8/2005 | Sipila et al. | 250/370.09 |
| 6,975,012 B2 | 12/2005 | Moriyama et al. | |
| 7,115,895 B2 | 10/2006 | von Kanel | |
| 7,355,185 B2 | 4/2008 | Yasuda et al. | |
| 2001/0032942 A1 | 10/2001 | Shima et al. | |
| 2004/0007671 A1 | 1/2004 | Sipila | |
| 2004/0129994 A1 | 7/2004 | Moriyama et al. | |

(Continued)

FOREIGN PATENT DOCUMENTS

EP   0571135   11/1993

(Continued)

OTHER PUBLICATIONS

Communication from European Patent Office for EP Application No. 08162513 mailed Feb. 2, 2011 (related European application).

(Continued)

*Primary Examiner* — David Porta
*Assistant Examiner* — Faye Boosalis
(74) *Attorney, Agent, or Firm* — Martin Fleit; Paul D. Bianco; Fleit Gibbons Gutman Bongini & Bianco PL

(57) ABSTRACT

The present invention discloses an X-ray imaging device comprising an X-ray absorber that comprises a plurality of semiconductor layers. The plurality of semiconductor layers comprise a substrate having a backside; and at least one absorption layer adapted to absorb at least one X-ray photon impinging on the at least one absorption layer that is adapted to correspondingly generate in response to the at least one impinging X-ray photon at least one electron-hole pair; and a readout unit, wherein the readout unit is operatively coupled to the X-ray absorber such to enable readout of the at least one electron-hole pair. Additional and alternative embodiments are described and claimed.

15 Claims, 10 Drawing Sheets

U.S. PATENT DOCUMENTS

| | | | |
|---|---|---|---|
| 2005/0116226 | A1 | 6/2005 | Von Kanel |
| 2006/0110844 | A1 | 5/2006 | Lee et al. |
| 2007/0090292 | A1 | 4/2007 | Yasuda et al. |
| 2010/0276736 | A1* | 11/2010 | Bocko et al. .................. 257/291 |

FOREIGN PATENT DOCUMENTS

| | | |
|---|---|---|
| EP | 1139429 | 10/2001 |
| EP | 1376105 | 1/2004 |
| EP | 1391940 | 2/2004 |
| EP | 1691422 A1 | 8/2006 |
| FR | 2810453 | 12/2001 |
| WO | 02/067271 | 8/2002 |
| WO | 04/001857 | 12/2003 |
| WO | 2005/079199 | 9/2005 |

OTHER PUBLICATIONS

Alig, Bloom and Struck "Scattering by ionization and phonon emission in semiconductors", Physical Review B, vol. 22, No. 12, Dec. 15, 1980.

Alig R. Casanova "Scattering by ionization and phonon emission in semicondutors. II. Monte Carlo calculations".

Baliga B. Jayant "Moder Power Devices", John Wiley & Sons, New York 1987, Chapter 3.

Schwarz et al. "Measurements with Si and GaAs pixel detectors bonded to photon counting readout chips", Nuclear Instruments and Methods in Physics Research A 466 (2001) 87-94.

Street et al. "Comparative Study of Pbl2 and Hgl2 as Direct Detector Materials for High Resolution X-ray Image Sensors", Proc. of SPIE, vol. 4320, pp. 1 (2001).

http://medipix.cern.web.ch (visited on Aug. 14, 2008).

http://www.dectris.ch (visited on Aug. 14, 2008).

A MEDIPIX2-Based Imaging System for Digital Mammography With Silicon Pixel Detectors, in IEEE Trans. Nucl. Sci 51, 3081 (2004), M. Bisogni et al.

Medipix collaboration (cf://medipix.web.cern.ch, Aug. 14, 2008).

Dectris AG (cf.http://www.dectris.com, Aug. 14, 2008).

Huang Zhihong et al: "Back-side-illuminated high-speed Ge photodetector fabricated on Si substrate using . . . ", Applied Physics Letters, vol. 85, No. 15, pp. 3286-3288.

Sheng-Da Liu et al.: "Hydrogenerated Amorphous Silicon-Germanium PIN X-Ray Detector" IEEE transactions on electron devices, vol. 48 No. 8 p. 1564, Figure 1.

Owens A et al.: "Compound semiconductor radiation detectors" Nuclear Instruments & Methods in Physics Research, Section A: Accelerators . . . p. 19.

Oehme M et al. "High-speed germanium photodiodes monolithically integrated on silicon with MBE" vol. 508, No. 1-2, pp. 393-395, figures 1,3.

European Search Report dated Jul. 2, 2009 for EP08162513.9 (related application).

* cited by examiner

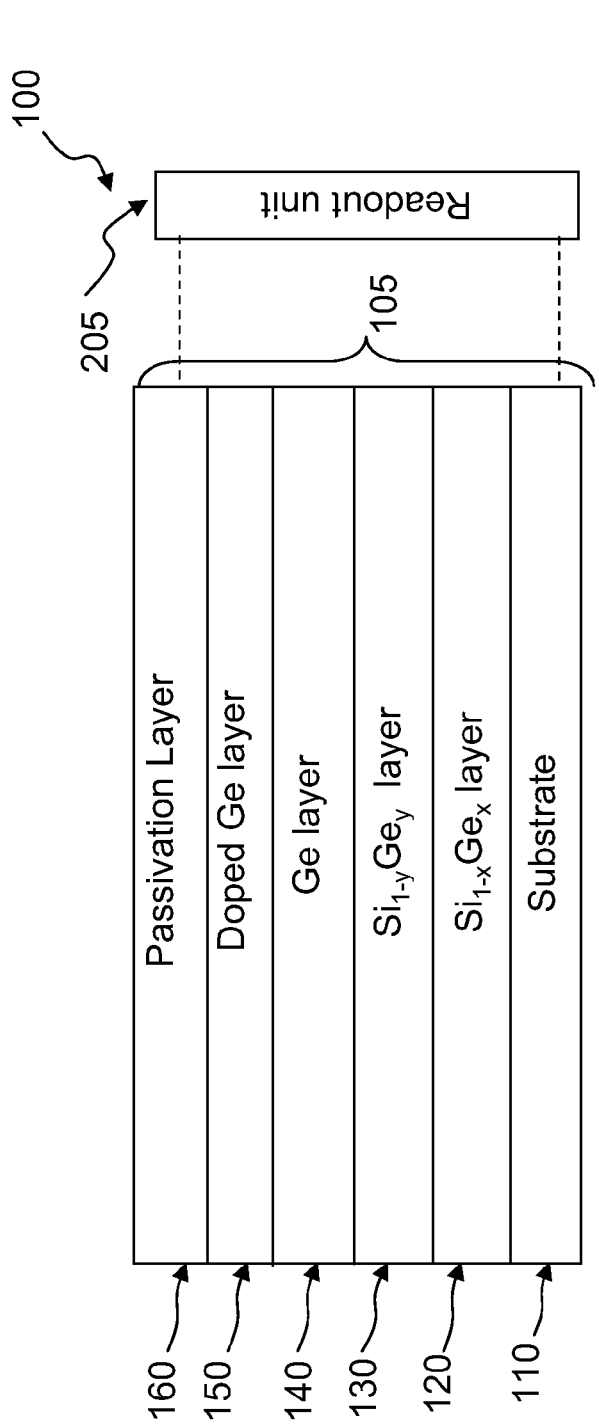
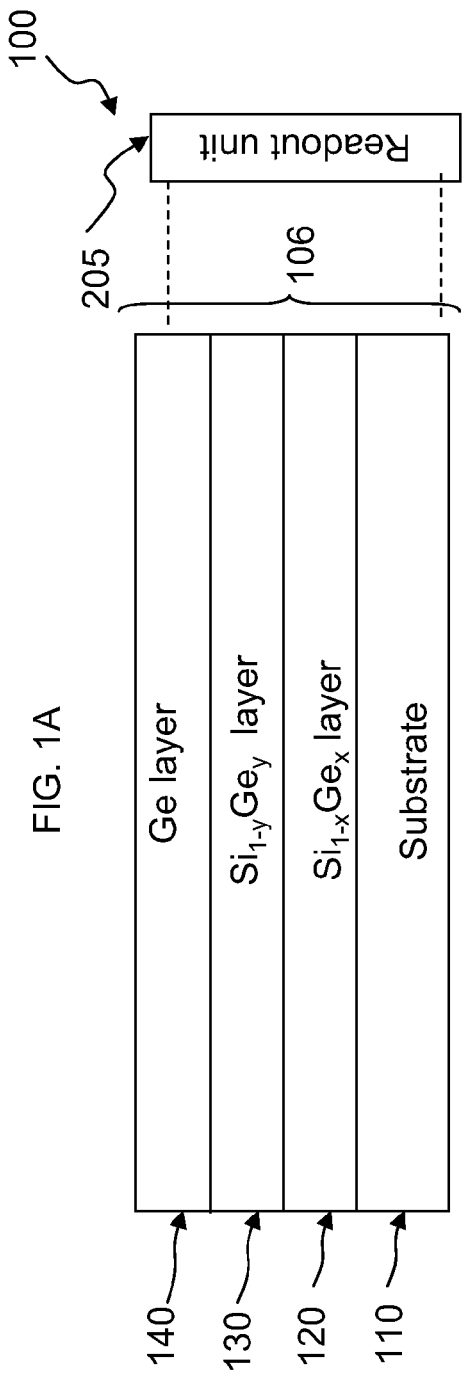
FIG. 1A
FIG. 1B

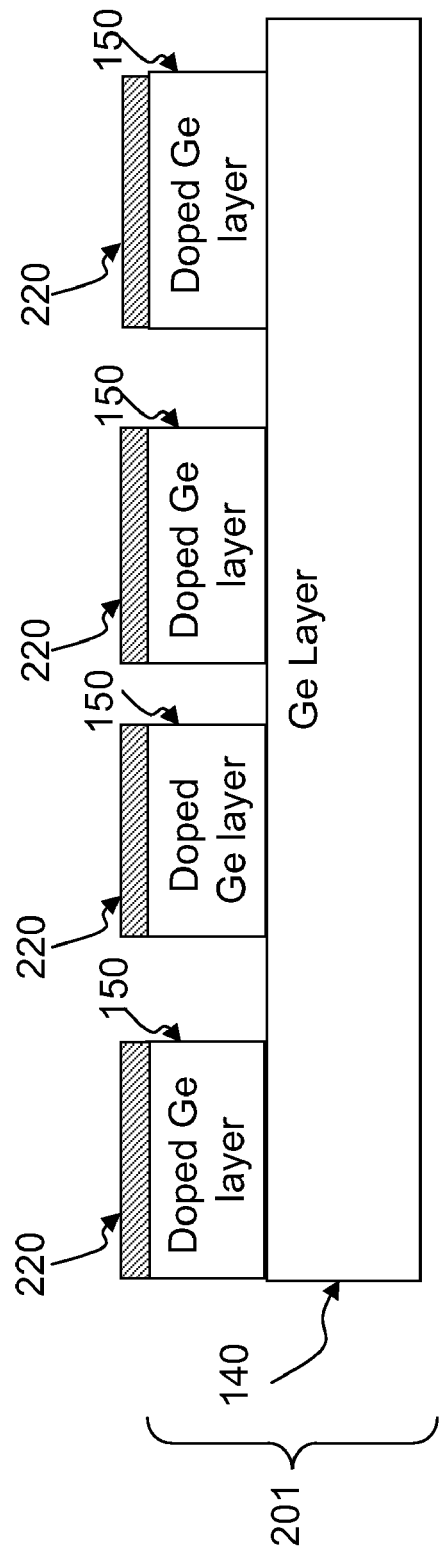
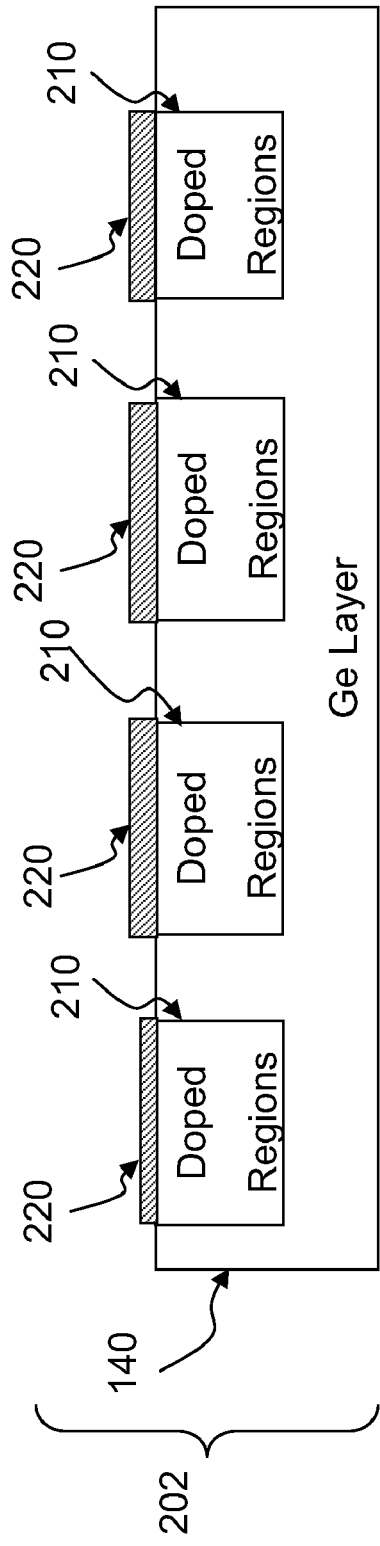

X-RAY IMAGING DEVICE AND METHOD FOR THE MANUFACTURING THEREOF

CROSS-REFERENCE TO RELATED APPLICATIONS

This patent application claims priority from U.S. Provisional Patent Application No. 60/956,391 filed on Aug. 17, 2007, the disclosure of which is incorporated herein by reference in its entirety.

FIELD OF THE INVENTION

The invention pertains to imaging devices, and more specifically to solid-state X-ray imaging devices.

BACKGROUND OF THE INVENTION

State-of the art digital X-ray imaging devices normally contain a scintillation layer, which converts at least one x-ray photon into visible light, and a photodiode array, which captures the visible image produced by the scintillation layer. Scintillating materials optimised for different X-ray energies are available. Therefore this approach is used for a wide variety of X-ray imaging applications. The efficiency of wavelength conversion in CsI(Tl) for example, a commonly used scintillation material, may be around 10%. This means that per keV of energy of an impinging X-ray photon one receives about 50 visible 2 eV photons (i.e., 100 eV). The subsequent conversion of the visible light into electron-hole pairs has normally an efficiency of below 50%, which yields about 25 electron-hole pairs per keV of X-ray energy.

In view of the relatively low efficiency of indirect conversion by way of scintillators, direct conversion of X-rays into electron-hole pairs would clearly be preferable. This is in fact possible by replacing the scintillator/photodetector combination by a suitable semiconductor structure.

When an X-ray photon is absorbed in a semiconductor, the photon's energy will be used to generate a number of electron-hole pairs. In the presence of an electric field the free electrons in the conduction band and the holes in the valence band will start to drift in opposite directions. For high enough quality of the semiconductor material, electron-hole pairs will be separated before they recombine. These charge carriers thus give rise to an electronic signal, the occurrence of which indicates absorption of an X-ray photon, and the strength of which is a measure of the photon's energy.

One of the most common detector materials is of course silicon, since it is the substrate material of most electronic circuits and therefore very well understood. Silicon based direct conversion X-ray imaging devices have been developed, e.g., by the Medipix collaboration (cf. http://medipix.web.cern.ch, visited on Aug. 14, 2008) or by Dectris AG (cf. http://www.dectris.ch, visited on Aug. 14, 2008). Such systems consist of one or several CMOS or CCD read-out chips, a silicon detection layer with suitable implantations on both sides to create an electric field when a voltage is applied across the substrate, and an intermediate connection layer which electrically connects every read-out pixel to the corresponding sensor pixel (see for example European Patent No. 0571135 to Collins et al., French Patent No. 2810453 to Pitault et al., and M. Bisogni et al., in IEEE Trans. Nucl. Sci. 51, 3081 (2004). However, in silicon one needs on average 3.6 eV to create one e-h pair (see for example Alig et al., "Scattering by ionization and phonon emission in semiconductors", Phys. Rev. B 22, 5565 (1980); and in "Scattering by ionization and phonon emission in semiconductors. II. Monte Carlo calculations" Phys. Rev. B 27, 968 (1983), which leads to 280 e-h pairs per keV of X-ray energy. The conversion efficiency is therefore more than ten times higher than in a scintillator-photodiode setup.

Schwarz et al. disclose in "Measurements with Si and GaAs pixel detectors bonded to photon counting readout chips", Nucl. Instr. Meth. A 466, 87 (2001) an absorption layer employing Gallium Arsenide (GaAs), which has a higher Z-number than Silicon.

Street et al. in "Comparative Study of $PbI_2$ and $HgI_2$ as Direct Detector Materials for High Resolution X-ray Image Sensors", Proc. of SPIE, Vol. 4320, pp. 1 (2001), report the properties of $HgI_2$ and $PbI_2$, as candidate materials for future direct detection X-ray image sensors.

EP patent 1,391,940 (Moryiama et al.) discloses a semiconductor radiation detector element of Schottky barrier type, comprising: a compound semiconductor crystal including cadmium and tellurium as main components; and voltage application means for applying voltage to the compound semiconductor crystal.

International patent application WO02/067271 (Ruzin) discloses an imaging and particle detection system using silicon enriched by heavier elements. More specifically, a Si absorption layer is alloyed with an enrichment material, such as germanium. The resulting alloys, e.g., $Si_{1-x}Ge_x$, are proposed to be bulk grown. The x content of Ge has been proposed to be kept below 20%.

U.S. Pat. No. 5,712,484 (Hideo et al.) discloses a germanium detector measuring an energy spectrum of gamma ray flux. The detector includes a copper cooling layer continuous over a periphery of the columnar germanium crystal.

WO 2005/079199A2 (King et al.) discloses an image sensor comprising an array of germanium photosensitive elements integrated with a silicon substrate and integrated with silicon readout circuits. The silicon transistors are formed first on a silicon substrate, using well known silicon wafer processing techniques. The germanium elements are subsequently formed overlying the silicon by epitaxial growth. The germanium elements are advantageously grown within surface openings of a dielectric cladding. Wafer processing techniques are applied to the elements to form isolated germanium photodiodes. Since temperatures needed for germanium processing are lower than those for silicon processing, the formation of the germanium devices need not affect the previously formed silicon devices. Insulating and metallic layers are then deposited and patterned to interconnect the silicon devices and to connect the germanium devices to the silicon circuits. The germanium elements are thus integrated to the silicon by epitaxial growth and integrated to the silicon circuitry by common metal layers.

US patent application 2006/0110844 (Jong-Jan Lee et al.) discloses a method of fabricating a thin film germanium photodetector. The method includes preparing a silicon substrate; fabricating a CMOS device on the silicon substrate; preparing a germanium substrate; preparing surfaces of each substrate for bonding; bonding the germanium substrate to the CMOS-bearing silicon substrate to form a bonded structure; removing a portion of the germanium substrate from the bonded structure; forming a PIN diode in the germanium substrate; removing a portion of the germanium layer by etching; and completing the germanium photo detector.

As is known in the art, epitaxial growth of Ge on Si substrates is hampered by the substantial difference in lattice parameters of the order of 4%. As a result of this large misfit but a few monolayers of Ge can be grown as a two-dimensional epitaxial film on a Si substrate. At larger thicknesses lattice relaxation sets in, first in elastically by way of island formation, and then plastically by means of misfit dislocations. While interfacial misfit dislocations do not necessarily have an adverse effect on device performance, the threading dislocations usually accompanying the relaxation process usually do.

Researchers have therefore been looking for ways to reduce the density of undesirable threading dislocations. A method for lowering this density turned out to be the method of grading. Here, a SiGe alloy is epitaxially grown instead of a pure Ge layer, whereby the Ge content is slowly increased as growth proceeds, until the final alloy composition is reached.

U.S. Pat. No. 5,221,413 (Brasen et al.) discloses such a grading method wherein by growing germanium-silicon alloy at high temperatures in excess of about 850° C. and increasing the germanium content at a gradient of less than about 25% per micrometer, one can grow on silicon large area heterostructures of graded $Ge_xSi_{1-x}$ alloy having a low level of threading dislocation defects. With low concentrations of germanium ($0.10 \leq x \leq 0.50$), the heterolayer can be used as a substrate for growing strained layer silicon devices such as MOSFETS. With high concentrations of Ge ($0.65 \leq x \leq 1.00$) the heterolayer can be used on silicon substrates as a buffer layer for indium gallium phosphide devices such as light emitting diodes and lasers. At concentrations of pure germanium ($x=1.00$), the heterolayer can be used for GaAs or GaAs/AlGaAs devices. This method requires relatively thick layers for grading up to pure Ge, since the grading rate needs to be kept typically below 10%/μm in order to be effective in reducing the density of threading dislocations. For the usual deposition methods such as chemical vapour deposition (CVD) and molecular beam epitaxy (MBE) the process is therefore relatively slow.

U.S. Pat. No. 6,537,370 (Hernandez et al.) discloses a method which consists in: (a) stabilization of the monocrystalline silicon substrate temperature at a first predetermined temperature $T_1$ of 400 to 500° C.; (b) chemical vapour deposition (CVD) of germanium at said first predetermined temperature $T_1$ until a base germanium layer is formed on the substrate, with a predetermined thickness less than the desired final thickness; (c) increasing the CVD temperature from said first predetermined temperature $T_1$ up to a second predetermined temperature $T_2$ of 750 to 850° C.; and (d) carrying on with CVD of germanium at said second predetermined temperature $T_2$ until the desired final thickness for the monocrystalline germanium final layer is obtained.

International Patent Application No. WO2004/001857 (Wada et al.) discloses a photodetector device includes a plurality of Ge epilayers that are grown on a substrate and annealed in a defined temperature range. The Ge epilayers form a tensile strained Ge layer that allows the photodetector device to operate in the C-band and L-band.

U.S. Pat. No. 7,115,895 (von Känel), which is incorporated herein by reference in its entirety, discloses a method for making a semiconductor heterostructure in a growth chamber with gas inlet comprises several steps. In a first step, a virtual substrate is formed on a silicon substrate, comprising a graded $Si_{1-x}Ge_x$ layer followed by a $Si_{1-x}Ge_x$ layer with a constant x, using a high-density, low-energy plasma enhanced chemical vapour deposition (LEPECVD) process. In this step, the growth rate is maintained above 2 nm/s and the substrate temperature may range from to 400° C. and 850° C. and the total reactive gas flow at the gas inlet ranging from 5 standard cubic centimetres (sccm) to 200 sccm. In another step, an active region is formed on said virtual substrate comprising a Ge-channel and a modulation-doped layer using a low-density, low-energy plasma enhanced chemical vapor deposition (LEPECVD) process. In this step, hydrogen ($H_2$) is introduced into the growth chamber to act as a surfactant, a substrate temperature is maintained between or substantially equal to 400° C. and 500° C. and a dopant gas is introduced in a pulsed manner into the growth chamber to provide for the modulation-doped layer. LEPECVD is based on high-density, low-energy plasma generated by a low-voltage DC arc discharge. High radical densities from precursor gases cracked in the dense plasma have been shown to result in growth rates as high as 10 nm/s, far above the rates achievable by CVD at substrate temperatures below 800° C. LEPECVD is thus a suitable method for reducing growth time of thick relaxed alloy buffer layers to acceptable levels.

BRIEF DESCRIPTION OF THE DRAWINGS

These and further features and advantages of the invention will become more clearly understood in the light of the ensuing description of embodiments thereof, given by way of example only, with reference to the accompanying figures, wherein:

FIG. 1A is a schematic block diagram illustration of an X-ray imaging device according to an embodiment of the invention;

FIG. 1B is a schematic block diagram illustration of an X-ray imaging device according to another embodiment of the invention FIG. 2A is a schematic illustration of a pixel structure according to an embodiment of the invention;

FIG. 2B is a schematic illustration of a pixel structure according to another embodiment of the invention;

FIG. 4A is a schematic side view illustration of an X-ray absorber according to an alternative embodiment of the invention;

FIG. 4B is a schematic side-view illustration of an X-ray absorber according to another alternative embodiment of the invention;

Figure 3:
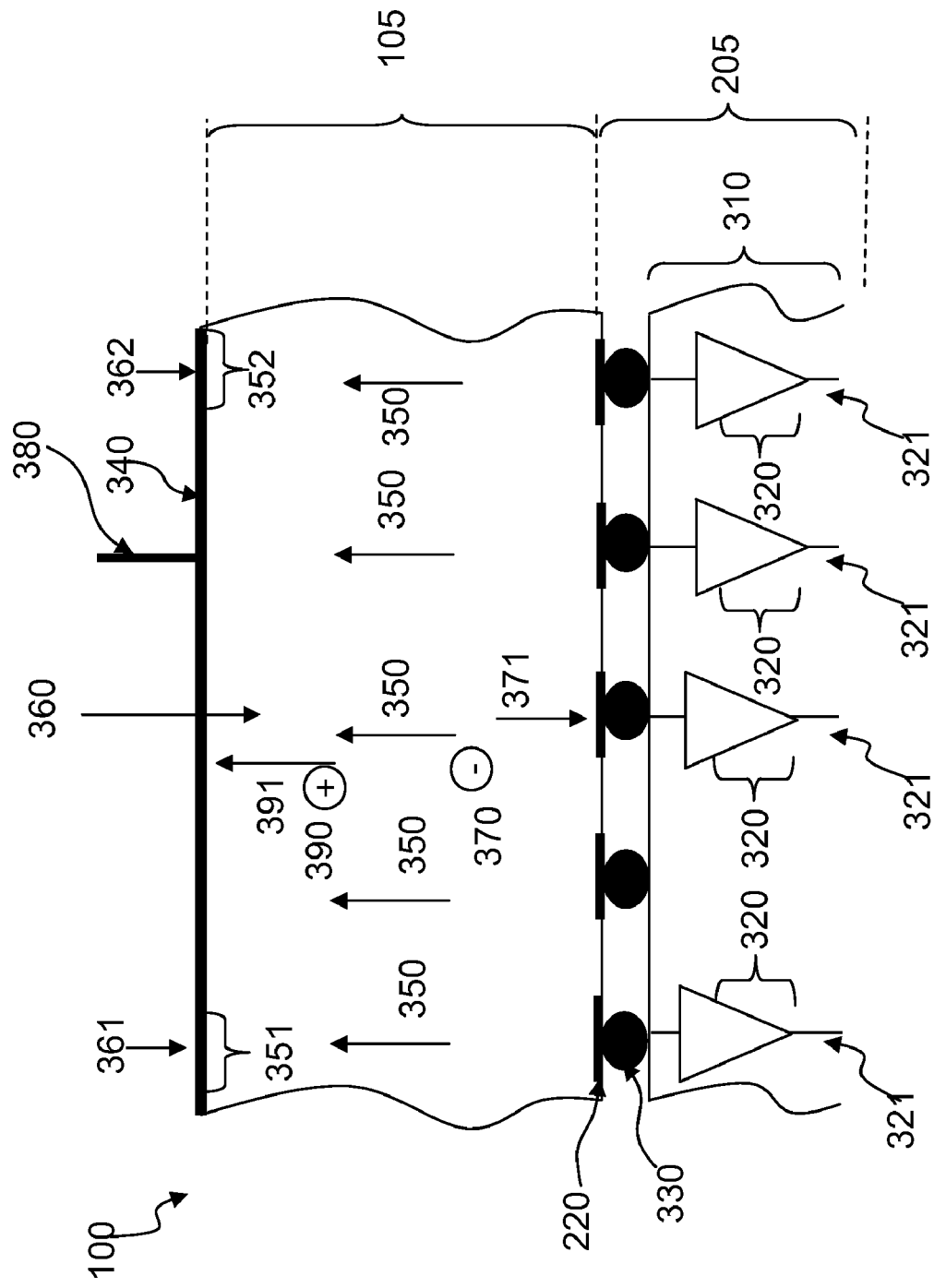
FIG. 3 is a schematic side-view illustration of an X-ray imaging device according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate identical elements but may not be referenced in the description for all figures.

DESCRIPTION OF SOME EMBODIMENT OF THE INVENTION

It is an object of the invention to provide an alternative direct conversion X-ray imaging device and method for manufacturing thereof. It should be noted that the term "direct conversion" refers to any X-ray imaging device that is operable in a scintillator-free manner.

In embodiments, the X-ray imaging device may include, for example, an X-ray absorber comprising a plurality of semiconductor layers. The plurality of semiconductor layers may include a substrate having a backside; and at least one absorption layer adapted to absorb at least one X-ray photon impinging on the at least one absorption layer that is adapted to correspondingly generate in response to the at least one impinging X-ray photon at least one electron-hole pair; and a readout unit, wherein the readout unit is operatively coupled to the X-ray absorber such to enable readout of the at least one electron-hole pair. More specifically, embodiments of the X-ray imaging device employ pixel elements based on semiconductor layers, wherein each pixel element is individually addressable by a read-out circuitry that may be based on a CMOS processed chip, such as to allow formation of an electronic signal from X-ray photons impinging on the pixel elements.

In some embodiments, the X-ray absorber may for example be monolithically integrated with the readout unit. In some other embodiments of the invention, the X-ray absorber may be mechanically and electrically coupled to the readout unit, for example, by employing suitable bonding structures which may be electrically conductive. In embodiments, the at least one absorption layer may include a $Si_{1-x}Ge_x$ layer provided on the substrate, wherein $0 \leq x \leq x_f$ and wherein the $Si_{1-x}Ge_x$ layer may be doped; an $Si_{1-y}Ge_y$ layer provided on the $Si_{1-x}Ge_x$ layer, wherein $x_f \leq y \leq 1$, and a Ge layer may be provided on said $Si_{1-y}Ge_y$ layer, wherein the Ge layer may be integrally formed with either one of the following: discrete doped Ge layers and doped regions, wherein the discrete doped Ge layers and the doped regions may have at least one metal pad provided thereon.

In embodiments, the Ge layer may have a thickness ranging from, for example, 50 μm to 500 μm.

In embodiments the readout unit may for example include a chip comprising circuitry, wherein the chip may be operatively coupled to the at least one metal pad; and a metallization layer may be provided on the backside, wherein applying a first reverse bias voltage on the metallization layer may generate an electric field such the said at least one electron-hole pair is separated and either the electron or the hole of the at least one electron-hole pair drifts to the at least one metal pad circuitry for readout.

In embodiments, the at least one absorption layer may for example include at least one first undoped Ge layer; and at least one second undoped Ge layer; wherein the at least one first undoped Ge layer may have a thickness ranging from, e.g., 0.5 μm to 1 μm, and wherein the at least one second undoped Ge layer may have a thickness ranging from, for example, 50 μm to 500 μm.

In embodiments, the readout unit may for example be integrally formed with the substrate and may comprise at least one doped region, and wherein the X-ray imaging device may further comprise: a patterned protective dielectric layer transversely disposed between the at least one first undoped Ge and the substrate; and either one of the following: doped regions in epitaxial parts of the at least one second undoped Ge layer, and Ge/Si layer above the second undoped Ge layer, wherein both the doped regions and said Ge/Si layers may be provided thereon and the at least one metal pad thereby forming a heterojunction diode; and wherein applying a second reverse bias voltage over said heterojunction diode may generate another electric field along the first and second undoped Ge layers, thereby possibly enabling the readout of the at least one electron-hole pair by the readout unit.

In embodiments, the first and the second undoped Ge layers may for example be provided on the backside of the substrate; wherein at least one implant and at least one well may be integrally formed with the substrate in an alternating manner to embody diodes for the collection of charge carriers generated in response the at least one impinging X-ray photon; wherein readout circuitry may be integrally formed with the at least one well; and wherein the implants may be electrically connected to the readout circuitry to enable the detection of the at least one electron-hole pair.

Moreover, embodiments of the invention may include for example methods for manufacturing the X-ray imaging device such to enable the operative coupling of the X-ray absorber with the readout unit. For example, embodiments of the present invention enable a relatively fast growth of semiconductor material, which constitutes the X-ray absorber, whilst employing a relatively low thermal budget during said growth. As a consequence, the readout unit can be operatively coupled with the X-ray absorber, e.g., as known in the art. Moreover, the readout unit may be implemented, e.g., as known in the art. The readout unit may for example be implemented by employing Complementary Metal-Oxide Semiconductor (CMOS) technology.

Moreover, the thermal budget being employed may for example be sufficiently low such to avoid the formation of crack(s) due to different thermal expansion coefficients between different semiconductor materials such as, for example, Ge and Si. However, despite the relatively low thermal budget, methods of the present invention enable epitaxial growth of at least some of the semiconductor material at a relatively high growth rate.

In embodiments, the method for manufacturing an X-ray imaging device may for example include the steps of providing a plurality of semiconductor layers which may comprise the substrate having a backside; and the at least one absorption layer adapted to absorb the at least one X-ray photon impinging on the at least one absorption layer that is adapted to correspondingly generate in response to the at least one impinging X-ray photon the at least one electron-hole pair; and providing the readout unit such that the readout unit is operatively coupled to the X-ray absorber to enable readout of the at least one electron-hole pair.

In embodiments, the method may for example include providing the $Si_{1-x}Ge_x$ layer on the substrate, wherein $0 \leq x \leq x_f$ and wherein the $Si_{1-x}Ge_x$ layer may be doped; providing an $Si_{1-y}Ge_y$ layer on the doped $Si_{1-x}Ge_x$ layer, wherein $x_f \leq y \leq 1$, providing the Ge layer on the $Si_{1-y}Ge_y$ layer, wherein the Ge layer may be integrally formed with either one of the following: discrete doped Ge layers and doped regions having the at least one metal pad provided thereon.

In embodiments, the method may for example include processing the chip to comprise circuitry; operatively coupling the chip to the at least one metal pad; providing metallization layer at the backside of the X-ray absorber, wherein by applying the first reverse bias voltage on the metallization layer the electric field may be generated causing the drifting of either one of the following: an electron and hole of the at least one electron-hole pair to the circuitry for readout.

In embodiments of the invention, the method may for example include, for example, providing the at least one first undoped Ge layer; and providing the at least one second undoped Ge layer.

In embodiments, the first and the second undoped Ge layer may for example be provided above the substrate.

In embodiments, the method may for example include providing the patterned protective dielectric layer in a transversely disposed manner between the at least one first undoped Ge and the substrate; providing either one of the following: doped regions in epitaxial parts of the second undoped Ge layer, and Ge/Si layer above the second undoped Ge layer; and providing on both the doped regions and said Ge/Si layers at least one metal pad thereby forming the heterojunction diode, wherein applying the second reverse bias voltage over the heterojunction diode causes the generation of the electric field along the first and second undoped Ge layers, thereby enabling the readout of the at least one electron-hole pair by the readout unit.

In embodiments, the method may for example include, for example, providing the first and the second undoped Ge layers on the backside; integrally forming with the substrate in an alternating manner at least one implant and at least one well to embody diodes for the collection of charge carriers generated in response to the at least one X-ray photon; and integrally forming readout circuitry in the at least one well; and electrically connecting the implants to the readout circuitry to enable the detection of the at least one electron-hole pair.

It should be noted that phrasing or terms such as "X-ray photons impinging on X-ray imaging device" refers to "X-ray photons impinging on pixel elements of the X-ray imaging device", as well as grammatical variations thereof.

It should be noted that terms such as "right", "left", "rightmost", "leftmost" "bottom", "below", "lowered", "low", "top", "above", "elevated", "high", "backside" as well as grammatical variations thereof as used herein do not necessarily indicate that, for example, a "bottom" component is below a "top" component, or that a component that is "below" is indeed "below" another component or that a component that is "above" is indeed "above" another component as such directions, components or both may be flipped, rotated, moved in space, placed in a diagonal orientation or position, placed horizontally or vertically, or similarly modified. Accordingly, it will be appreciated that terms such as, for example, "right", "left", "rightmost", "leftmost" "bottom", "below", "lowered", "low", "top", "above", "elevated", "high" and "backside" may be used herein for exemplary purposes only, to illustrate the relative positioning or placement of certain components, to indicate a first and a second component or to do both.

It should be noted that the term "absorption of X-ray radiation" in a given material as well as grammatical variations thereof refers at least to the process of generating an electron-hole pair in the same material. Term like "detection", "detecting" as well grammatical variations thereof refers to the detecting of an electron-hole pair generated in the material.

It should be understood that an embodiment is an example or implementation of the inventions. The various appearances of "one embodiment," "an embodiment" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Reference in the specification to "one embodiment", "an embodiment", "some embodiments" or "other embodiments" means that a particular feature, structure, or characteristic described in connection with the embodiments is included in at least one embodiment, but not necessarily all embodiments, of the inventions.

It should be understood that the phraseology and terminology employed herein is not to be construed as limiting and is for descriptive purpose only.

The principles and uses of the teachings of the present invention may be better understood with reference to the accompanying description, figures and examples.

It should be understood that the details set forth herein do not construe a limitation to an application of the invention. Furthermore, it should be understood that the invention can be carried out or practiced in various ways and that the invention can be implemented in embodiments other than the ones outlined in the description below.

It should be understood that the terms "including", "comprising", "consisting" and grammatical variants thereof do not preclude the addition of one or more components, features, steps, integers or groups thereof.

The meaning of "in" includes "in" and "on". The term "based on" is not exclusive and provides for being based on additional factors not described, unless otherwise indicated.

If the specification or claims refer to "an additional" element, that does not preclude there being more than one of the additional element.

It should be understood that where the claims or specification refer to "a" or "an" element, such reference is not to be construed as there being only one of that element.

It should be understood that where the specification states that a component, feature, structure, or characteristic "may", "might", "can" or "could" be included, that particular component, feature, structure, or characteristic is not required to be included.

The term "method" and "process" refers to manners, means, techniques and procedures for accomplishing a given task including, but is not limited to those manners, means, techniques and procedures either known to, or readily developed from known manners, means, techniques and procedures by practitioners of the art to which the invention belongs.

The descriptions, examples, methods and materials presented in the claims and the specification are not to be construed as limiting but rather as illustrative only.

Meanings of technical and scientific terms used herein ought to be commonly understood as by one of ordinary skill in the art to which the invention belongs, unless otherwise defined.

The present invention can be implemented in the testing or practice with methods and materials equivalent or similar to those described herein.

Reference is now made to FIG. 1A. According to an embodiment of the invention, an X-ray imaging device 100 includes an X-ray absorber 105 that is operatively connected to a readout unit 205.

X-ray absorber 105 may include a substrate 110, which may be embodied, for example, by at least one of the following materials: p-doped Si and n-doped Si. Substrate 110 may have a relatively high resistivity ρ ranging, for example, from 500 Ω*cm to 15,000 Ω*cm, or a relatively very high resistivity ρ ranging for example, from 5000 Ω*cm to 15,000 Ω*cm. The backside of substrate 110 may contain a highly doped contact region, formed, e.g., by ion implantation as known in the art, whereby the doping type may be the same as that of the high resistivity region of substrate 110.

X-ray absorber 105 may further include a $Si_{1-x}Ge_x$ layer 120 of semiconductor material (which may be doped), wherein $0 \leq x \leq x_f$, i.e., $Si_{1-x}Ge_x$ layer 120 is graded.

On $Si_{1-x}Ge_x$ layer 120, a $Si_{1-y}Ge_y$ layer 130 may be provided (e.g., by growing), wherein $x_f \leq y \leq 1$, i.e., $Si_{1-y}Ge_y$ layer 130 may be graded. X-ray absorber 105 may further include a Ge layer 140, and a doped Ge layer 150, which may have a thickness of, for example 100 nm. On doped Ge layer 150, a passivation layer 160 made of, e.g., doped Si, may be provided to reduce or eliminate edge leakage current. Passivation layer 160 may be just a few nanometers thick, for example 3 nm-5 nm. The doping concentration of doped Ge layers 150 and passivation layer 160 may be higher than, for example, $10^{18}$ cm$^{-3}$ or even higher than $10^{19}$ cm$^{-3}$.

If substrate 110 is embodied by a p-doped Si wafer, then $Si_{1-x}Ge_x$ layer 120 may be p-doped, doped Ge layer 150 may be n$^+$-doped, and passivation layer 160 may be n$^+$-doped. Alternatively, if substrate 110 is embodied by an n-doped Si wafer, then $Si_{1-x}Ge_x$ layer 120 may be n-doped, doped Ge layer 150 may be p$^+$-doped and passivation layer 160 may be p$^+$-doped.

Generally, X-rays absorbed in Ge layer 140, $Si_{1-y}Ge_y$ layer 130, $Si_{1-x}Ge_x$ layer 120, and substrate 110 will be detected with a very high probability. Of these, most x-rays will be absorbed in Ge layer 140. But a small part (<1%) of the X-rays may also be absorbed in doped Ge layer 150 and passivation layer 160. The probability however that X-ray absorbed in doped Ge layer 150 and passivation layer 160 will be detected may be very small.

A method of manufacturing of X-ray absorber 105, according to an embodiment of the invention, is outlined hereinafter. In accordance to an embodiment of the method of manufacturing, substrate 110 may be subjected to a cleaning step by, e.g., hydrogen, prior to or after introducing substrate 110 into an epitaxial deposition chamber (not shown). The epitaxial deposition chamber may be adapted to process wafers having a diameter of, for example, at least 200 mm; at least 300 mm; and higher. In any event, epitaxy may only be employed after doping substrate 110.

The epitaxial deposition chamber may be turbo-molecular pumped to pressures in the range of, for example, $10^{-4}$ to $10^{-1}$ mbar during epitaxial growth under reactive gas load. The epitaxial deposition chamber may be direct communication with an (radio frequency) RF plasma source (not shown), capable of providing high-density low-energy plasma in the deposition region. For example, plasma densities and ion energies similar to those present in low-voltage DC arc discharges as described in U.S. Pat. No. 7,115,895 may be used.

Prior to rising the substrate temperature to a value suitable for epitaxy, substrate 110 may be subjected to a cleaning step, e.g., as known in the art. For example, hydrogen plasma (not shown) having relatively low energy below 15 eV excited by the RF source in operative connection with the deposition chamber may be flown into the same, thereby causing substrate 110 to be subjected to the hydrogen plasma.

In an alternative embodiment, the hydrogen cleaning step may be carried out in a separate cleaning chamber (not shown), whereby the displacement of substrate 110 from the cleaning chamber to the deposition chamber may be accomplished, e.g., as known in the art, for example, by means of a wafer handler.

After the optional hydrogen plasma cleaning step, the temperature of substrate 110 is raised to a value $T_1$, which is the temperature suitable for growing $Si_{1-x}Ge_x$ layer 120 on substrate 110. For $Si_{1-x}Ge_x$ layer 120, $T_1$ may range, for example, from 700° C. to 800° C., or more specifically, may be about 750° C. $Si_{1-x}Ge_x$ layer 120 may then be epitaxially grown, for example, by a plasma-enhanced chemical vapour deposition process. Relatively high-density and low-energy plasma (not shown) is generated in the deposition region by the RF plasma source that is operatively connected to the epitaxial deposition chamber. Precursor gases (not shown) may be introduced into the epitaxial deposition chamber. From these precursor gases, the high-density low-energy plasma forms in a reactive gas phase highly reactive radicals (not shown). For the deposition of $Si_{1-x}Ge_x$ layer 120, precursor gases may be embodied by one or a mixture of the following: pure $SiH_4$, pure $GeH_4$, noble gases, and hydrogen. In an embodiment of the invention, $Si_{1-x}Ge_x$ layer 120 may be doped, e.g., during growth, for example, by mixing a suitable doping agent (not shown) such as, for example, $B_2H_6$, diluted with a suitable precursor gas such as, for example, a noble gas (not shown) to the reactive gas phase. In order to minimize the density of threading dislocations, the "x" content of Ge may be increased slowly such as to keep the grading rate below, for example, about 10%/µm thickness. A linear grading profile may facilitate keeping the density of the threading dislocations to, for example, <$10^7$ dislocations/cm$^2$.

It should be noted that the term "linear" also encompasses the meaning of the term "substantially linear".

In an embodiment of the invention, the substrate temperature may be lowered during growth of $Si_{1-x}Ge_x$ layer 120 from the initial temperature $T_1$ to a final value $T_2$ depending on the final Ge content $x_f$ of $Si_{1-x}Ge_x$ layer 120. Lowering of the temperature may start for example at a Ge content x of 20%, and thereafter proceed in a linear fashion with increasing x, such that as a function of x it evolves according to $T(x)=T_1-(x-0.2)(T_1-450° C.)/0.8$.

After reaching a final Ge content $x_f$, where $0 \leq x_f \leq 1$, the flow of the doping agent may be stopped while growth of $Si_{1-y}Ge_y$ layer 130 continues, whereby the Ge content in $Si_{1-y}Ge_y$ layer 130 may vary for example, in a linear fashion from $y=x_f$ up to $y=1$. In some embodiments of the invention, the grading rate and temperature profile during growth of $Si_{1-y}Ge_y$ layer 130 may be chosen to be equal to the grading rate and temperature profile used for growing $Si_{1-x}Ge_x$ layer 120. It should be noted that the term "equal" as used herein as well as grammatical variations thereof also encompasses the meaning of the term "generally equal".

Ge layer 140 may then be grown at a substrate temperature that may take values ranging, for example, from 400° C. to 600° C., or more specifically, be at a temperature of, for example, about 450° C. The final thickness of Ge layer 140 may be chosen in accordance with the fraction of X-ray photons to be absorbed, while obtaining dark currents due to thermal generation processes at acceptable levels (e.g., less than $10^{-3}$ A*cm$^{-2}$) for the read-out circuitry. The thickness of Ge layer 140 may range, for example, from 50 µm to 500 µm, and in some other embodiments range for example from 100 µm to 300 µm.

In some embodiments of the invention, the plasma density and gas flows are adjusted such that $Si_{1-x}Ge_x$ layer 120, $Si_{1-y}Ge_y$ layer 130 and Ge layer 140 are grown at rates higher than, for example, 2 nm/s, or at rates higher than, for example, 5 nm/s. Such exemplary growth rates may be achieved, for example, by employing reactive gas flows ranging for example from 30 (standard cubic centimetres) sccm to 80 sccm for epitaxy on substrate 110 of, e.g., 200 mm.

After growth of Ge layer 140, doped Ge layer 150 may be grown thereon, for example, in-situ. The temperature for growing doped Ge layer 150 may range, for example, between 400° C. and 600° C., or more specifically about 450 C. The growth rate for doped Ge layer 150 may be equal to or lower than the growth rate of Ge layer 140, and may be doped by admixing a suitable doping agent such as, for example, $PH_3$, diluted with a suitable precursor gas (e.g. a noble gas) to the reactive gas phase. At last, passivation layer 160 embodied by a thin passivation layer of, for example 3-5 nm thickness, may be provided (e.g., by growing) on doped Ge layer 150, wherein temperature during growth may be equal or close to that used for growing doped Ge layer 150. Passivation layer 160 may be employed to reduce surface recombination.

Additional reference is now made to FIG. 1B. According to some embodiments of the invention, an X-ray absorber 106 may not include doped Ge layer 150 above Ge layer 140. Such an X-ray absorber is hereinafter referred to as being "layer-less" above Ge layer 140 although X-ray absorber 106 may include, for example, a metallization layer (not shown) and/or a passivation layer (not shown).

Reference is now made to FIG. 2A. According to some embodiments of the invention, X-ray absorber 105 may be unloaded from the growth chamber and subjected to a method of patterning, e.g., as known in the art, and the formation of at least one discrete metal pad 220, wherein each metal pad 220 may constitute a pixel element of X-ray imaging device 100.

In the embodiment for example in which passivation layer 160 is present, the same passivation layer 160 and doped Ge layer 150 may be patterned in a manner resulting in the formation of discrete doped Ge layers 150 provided on Ge layer 140, wherein the formed discrete doped Ge layers 150 may be spaced apart equally. In the embodiment in which passivation layer 160 is initially not provided on doped Ge layer 150, basically the same method of patterning may be applied. However, some other parameters may be used during the patterning to obtain the formation of discrete doped Ge layers 150 provided on passivation layer 160. For example, etching depth may be set differently for the embodiment in which passivation layer 160 is present, compared to the embodiment in which passivation layer 160 is not present. Such a method for patterning may be implemented, for example, by ion-etching and/or wet chemical etching. Ge layer 140 having provided thereon discrete doped Ge layers 150 may constitute herein pixel structure 201.

Additional reference is now made to FIG. 2B. In the embodiment wherein X-ray absorber 106 above Ge layer 140 (cf. FIG. 1B) neither includes doped Ge layer nor doped Si cap, Ge layer 140 may be patterned with suitably doped regions 210 by subjecting Ge layer 140 to the method of, for example, selective ion implantation, which may include the step of annealing. Ge layer 140 having doped regions 210 may is herein referred to as a "pixel structure 202".

It should be noted that type of doping of doped Ge layer(s) 150 (FIG. 2A) and of regions 210 (FIG. 2B) depends on the doping of substrate 110. For example, if substrate 110 is implemented by p-doped Si, then discrete doped Ge layers 150 and regions 210 may be $n^+$-doped. Conversely, if substrate 110 is, for example, implemented by n-doped Si, then discrete doped Ge layers 150 and regions 210 may be $p^+$-doped.

Both at least some of the top surface of discrete doped Ge layers 150, as well as some of the top surface of regions 210 may be metalized by using methods, e.g., as known in the art following optional procedures for the formation of metal pads 220.

It should be noted that the embodiment disclosed in FIG. 2A of in-situ doped doped Ge layers 150 needs a lower thermal budget than the embodiment disclosed in FIG. 2B. Accordingly, with reference to FIG. 2A and FIG. 2B, Ge layer 140 is integrally formed with either one of the following: discrete doped Ge layers 150, and doped regions 210.

Additional reference is now made on FIG. 3. In embodiments of the invention, readout unit 205 may include a chip 310 comprising circuitry 320. Readout unit 205 may further include electrically conductive bumps 330 that enable the operative coupling of respective circuitry 320 with metal pads 220 of X-ray absorber 105. Bonding of X-ray absorber 105 with readout circuitry 320 may be accomplished in other ways, e.g., as known in the art. For example, bumps 330 may be adhesive, thereby enabling the bonding of circuitry 320 to respective metal pads 220 and accordingly to X-ray absorber 105. A metallization layer 340 at the backside of X-ray absorber 105 may be formed prior or after the bonding of X-ray absorber 105 with circuitry 320. According to some embodiments of the invention, circuitries 320 for X-ray imaging may be processed on a chip 310 (made of e.g., Si wafer) using, for example, standard CMOS processing.

Each circuitry 320 may comprise one amplifier stage, which may be implemented, for example, by a pulse-sensitive charge amplifier, as well as other analogue and digital circuit elements which allow detecting and/or storing and/or transferring the information of the absorption of at least one X-ray photon. Outputs 321 of circuitry 320 are then taken over by read-out circuits (not shown), e.g., as known in the art.

Upon applying a suitable reverse bias voltage 380 on the backside of substrate 110 an electric field 350 is created in the sensor layer. An impinging at least one X-ray photon 360 will eventually be absorbed in one of the layers of absorber 105 and create at least one electron-hole pair. Due to electric field 350 the electron-hole pairs will be separated before being able to recombine. If for example substrate 110 is p-doped, then holes 390 will drift along the electric field lines (schematically illustrated with arrow 391) towards metallization layer 340, whereas electrons 370 will drift towards metal pads 220, as is schematically illustrated with arrow 371.

It should be noted that the crystal structures of the layers of absorber 105 are monolithic and/or homogeneous, or at least sufficiently monolithic and/or sufficiently homogeneous, such that electron-holes pairs subjected to electric fields 350 drift to the respective circuitry 320 that may correspond to the location at which the at least one X-ray photon 360 was incident. For example, at least one X-ray photon 361 incident in region 351 may result in the readout of electrical current by leftmost circuitry 320, whereas at least one x-ray photon 362 that is incident on region 352 may result in the readout of electrical current by rightmost circuitry 320.

In order to enable a controlled voltage drop towards the scribe edges of the sensor chips, suitable guard-rings (not shown) may be implemented, as described in B. J. Baliga, Modern Power Devices, chapter 3, Wiley, New York 1987. This can be done, for example, at the chip's 310 periphery either, e.g., on the free Ge surface or, e.g., on the free silicon surface of X-ray absorber 105.

Reference is now made to FIG. 4. X-ray absorber 405 comprises a doped substrate 410 (hereinafter referred to as "substrate 410") made of e.g., Si(001), whereon a first undoped Ge layer 420 is provided. X-ray absorber 405 further comprises a second undoped Ge layer 430 on top of first undoped Ge layer 420, as well as a doped Ge layer 440 on top of second undoped Ge layer 430. Finally, X-ray absorber 405 may further comprise a passivation layer 450 made of, e.g., a doped or heavily doped Si cap, provided on top of doped Ge layer 440.

Identical or similar methods and apparatuses as those outlined hereinabove for manufacturing X-ray absorber 105 may also be employed for the manufacturing of X-ray absorber 405. Accordingly, substrate 410, which may be embodied by a suitably pre-cleaned doped Si wafer having a resistivity ρ ranging, for example, from 500 Ω*cm to 15,000 Ω*cm or, for example, ranging from, e.g., 5000 Ω*cm to 15,000 Ω*cm, and a heavily doped backside implant of the same doping type, is introduced into the epitaxial deposition chamber and may be cleaned, for example, by being subjected to an optional hydrogen clean in a low-energy plasma provided by the RF plasma. In an alternative embodiment, the hydrogen cleaning step may be carried out in the separate cleaning chamber, whereby the displacement of substrate 410 from the cleaning chamber to the deposition chamber may be accomplished, e.g., as known in the art, for example, by means of a wafer handler.

Temperature of substrate 410 may then be raised to a temperature $T_3$, which may range or be equal to for example, from 300° C. to 600° C. More specifically, temperature $T_3$ may for example be equal to 500° C. First undoped Ge layer 420 made of, for example, undoped Ge may then be epitaxially grown, e.g., as known in the art by, for example, low-energy plasma enhanced chemical vapour deposition process. Precursor gases that may be used for the growth of first undoped Ge layer 420 may include, for example, pure $GeH_4$, noble gases, hydrogen and any suitable mixture thereof.

First undoped Ge layer 420 may be grown to a thickness that may range, for example, from 100 nm to 1 µm; or to a thickness that may range, for example, from 0.5 µm to 1 µm. After growth, first undoped Ge layer 420 may be subjected to thermal annealing, wherein the temperature of substrate 410 and first undoped Ge layer 420 is raised from $T_3$ to $T_4$ and lowered back to $T_3$ periodically for up to, for example, 10 periods. The temperature of $T_4$ may be as follows: $800°\,C. \leq T_4 \leq 900°\,C$. Anneals of the order of a few minutes like, for example, 1-20 minutes at $T_4$ may be used. Threading dislocation densities may decrease with a growing number of annealing periods. However, a limiting number may be asymptotically reached after, for example, 10 periods of annealing. In one embodiment of the invention, annealing can be carried out, e.g., as known in the art, for example in the epitaxial deposition chamber or, alternatively, in a separate annealing furnace such as, for example, a rapid thermal annealing furnace.

In an alternative version of this embodiment, the thickness of first undoped Ge layer 420 may range, for example, from to 5 nm to 200 nm, whilst the temperature of substrate 410 may be, for example, in the range of about 200° C. to 500° C.; or for example in the range of about 250° C.-350° C. In said alternative embodiment it may be advisable to provide, e.g., by deposition, a protecting cap layer (not shown) (e.g., Si cap) on first undoped Ge layer 420 prior to performing the annealing step described above with reference to FIG. 4. However, after said annealing step, the cap layer may have to be removed prior to the growth of subsequent layers such as, for example, second undoped Ge layer 430. Removal of the cap layer may be accomplished, e.g., as known in the art by, for example, subjecting the cap layer to a wet chemical etching step.

After the annealing, the epitaxial layer structure comprising of substrate 410 and first undoped Ge layer 420 may have to be subjected to an intermediate cleaning step, prior to providing second undoped Ge layer 430 by growing the same on first undoped Ge layer 420. During growth of second undoped Ge layer 430, the temperature thereof may range, for example, from 400° C. to 700° C. or, for example, be equal to 500° C. In some embodiments of the invention, second undoped Ge layers 430 may be grown at even lower temperatures that may range, for example, from 400° C. to 450° C. in order to avoid the formation of thermal cracks.

The thickness of second undoped Ge layer 430 may be chosen in accordance with the number of X-ray photons to be absorbed, while keeping dark currents due to thermal generation processes at acceptable levels. Accordingly, the thickness of second undoped Ge layer 430 may range from 50 µm to 500 µm; or range for example from 100 µm to 300 µm.

The plasma density and gas flows may be adjusted such as to allow second undoped Ge layer 430 to be grown at rates of at least, for example, 2 nm/s; or at rates of, for example at least 5 nm/s. Such growth rates may be achieved, for example, by employing reactive gas flows ranging from, for example, 30 sccm to 80 sccm for epitaxy on a, e.g., 200 mm wafer. It should be noted that first undoped Ge layer 420 may be grown at lower rate such as, for example, at rates that are lower than 2 nm/s. In some embodiments of the invention, doped Ge layer 440, which may be embodied, for example, by a thin heavily doped Ge layer, may be grown on top of second undoped Ge layer 430. During growth of doped Ge layer 440, the temperature thereof may be equal or held close to that of second undoped Ge layer 430. Doped Ge layer 440 can be grown at equal or lower rate as second undoped Ge layer 430 for example, by admixing a doping gas diluted with a noble gas to the reactive gas phase. At last, a passivation layer 450 may be grown at a temperature that may equal to or below the temperature of underlying doped Ge layer 440.

After growth of passivation layer 450, the X-ray absorber may be unloaded from the deposition reactor and thereafter be subjected to methods of patterning, for example, as outlined hereinabove with reference to FIG. 2A and FIG. 2B. Moreover, X-ray absorber 405 may be operatively coupled to a readout unit such as, for example, readout unit 205 in a manner, for example, that may be equal or similar to the operative coupling described above with reference to readout unit 205 and X-ray absorber 105 described hereinabove with reference to FIG. 3. Correspondingly, as already outlined hereinabove with reference to FIG. 3, in order to enable a controlled voltage drop towards scribe edges of chip 310, suitable guard-rings may be implemented as already outlined hereinabove with reference to FIG. 1 and FIG. 3.

Similar to what is outlined hereinabove with reference to X-ray absorber 105, the type of doping that is employed in a particular layer or substrate in X-ray absorber 405 determines the type of doping of the other layers. If for example, substrate 410 is p-doped, then doped Ge layer 440 and passivation layer 450 are n-doped, and regions 210 are n-doped. On the other hand, if substrate 410 is n-doped, then doped Ge layer 440 and passivation layer 450 may have to be p-doped, and regions 210 are p-doped.

Referring now to FIG. 4B, an X-ray absorber 406 may not include doped Ge layer 440 above second undoped Ge layer 430. X-ray absorber 406 is hereinafter to be referred to as being "layer-less", although it may include a passivation layer (not shown) and/or a metallization layer (not shown) above second undoped Ge layer 430. The patterning of second undoped Ge layer 430 may be accomplished, for example, by employing similar or equal methods as those described hereinabove with reference to the patterning of Ge layer 140 outlined in connection with FIG. 2B.

Figure 5A:
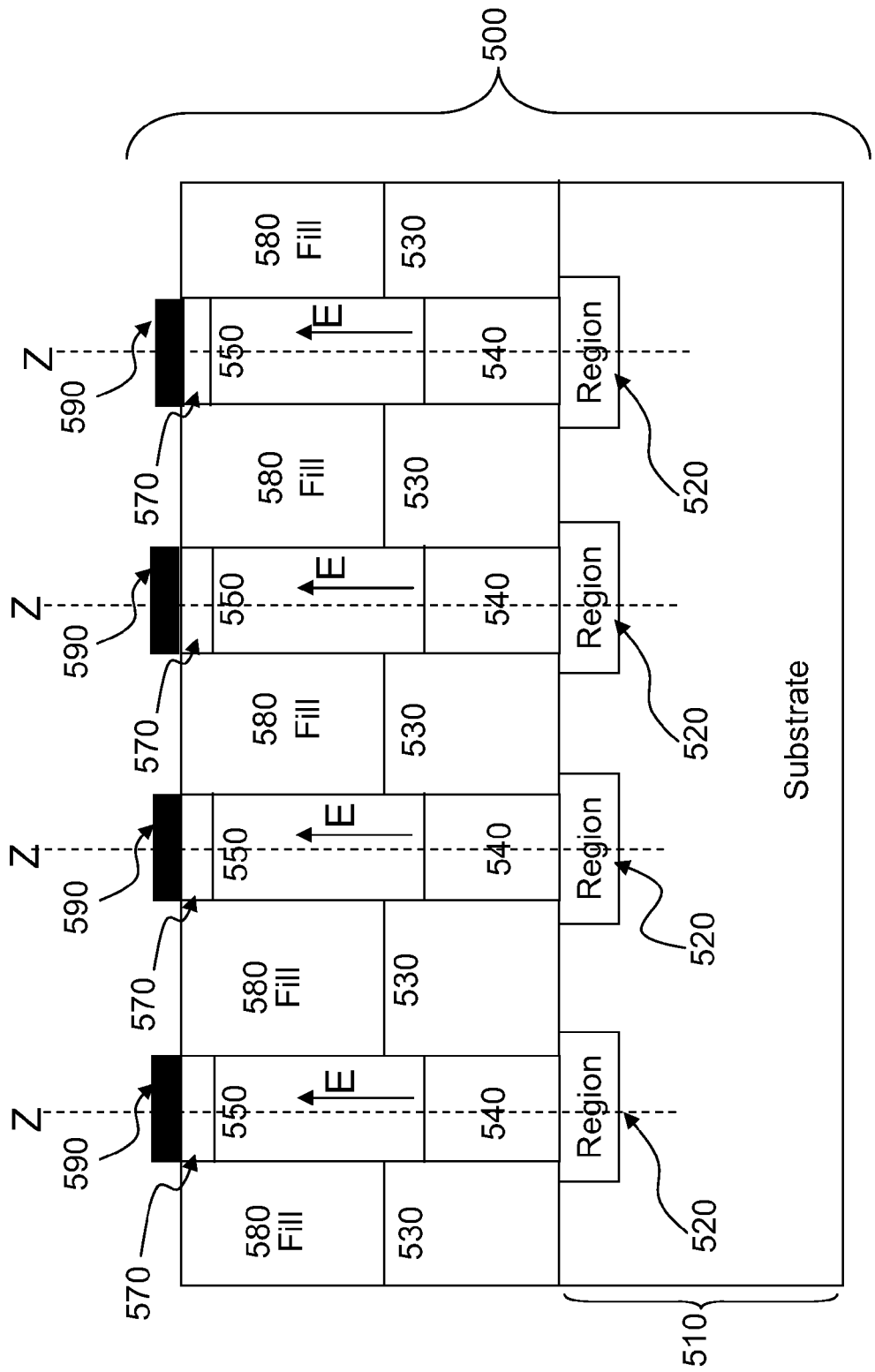
FIG. 5A is a schematic side-view illustration of an X-ray imaging device according to an additional embodiment of the invention.

Reference is now made to FIG. 5A. In some embodiments of the invention, a readout unit may be monolithically integrated and operatively coupled with an X-ray absorber. Such a readout unit may, for example, be embodied by a chip that may be processed according to, e.g., CMOS technology. In the embodiment in which the chip is processed in accordance to CMOS technology, all process steps are finalized including the metallization steps, prior to the growth of any additional layers. The metallization steps may be modified in order to allow a higher thermal budget than a CMOS technology employing standard metallisation. Metallization allowing higher thermal budget enables the implementation of a nucleation step of an X-ray sensitive Ge layer, which requires thermal annealing as outlined herein.

According to some embodiments of the invention, an X-ray imaging device 500 may include, for example, a substrate 510 made of, e.g., Si, for example processed according to CMOS technology, wherein substrate 510 is integrally formed with a readout unit and may have at least one doped region 520. X-ray imaging device 500 may further comprise monolithically integrated X-ray absorption layers such as, for example, first undoped Ge layer 540 and second undoped Ge layer 550, and at least one protective dielectric layer 530, which may be made of, for example, Silicon Oxide. Dielectric layer 530 may be patterned by employing methods, e.g., as known in the art, prior to introducing substrate 510 into the epitaxy reactor, such as to expose window regions into which first undoped Ge layer 540 may be epitaxially grown. The window regions of dielectric layer 530 are arranged transversely across the surface of substrate 510 such that their symmetry axes Z are aligned with the symmetry axes of regions 520, on top of which the epitaxial part of first undoped Ge layer 540 is hence grown. First undoped Ge layer 540 is chosen to be thinner than dielectric layer 530, or even much thinner, for example one tenth as thick. X-ray imaging device 500 may further include undoped absorber layers 550 (made of, e.g., Ge) integrally formed with the top of first undoped Ge layers 540. X-ray imaging device 500 may further include filling material 580, which may for example be made of one of the following: e.g. silicon oxide, silicon nitride and an epoxy resin, wherein filling material 580 may be integrally formed on the top of dielectric layer 530 and between layers 550. In some embodiments of the invention, X-ray imaging device 500 may further include doped or highly doped Ge and/or Si layers and/or of a doped Si cap on top of doped Ge (hereinafter referred to as Ge/Si layers 570), wherein Ge/Si layers 570 are integrally formed with respective layers 550. At least some of Ge/Si layers 570 may employ metal pads 590.

Layers 550 and optionally first undoped Ge layers 540 constitute absorbers for at least one X-ray photon. Moreover, each column of regions 520, first undoped Ge layer 540 and optionally layer 550, Ge/Si layer 570 and metal pad 590 may constitute a pixel element of X-ray imaging device 500.

Ge/Si layers 570 may be embodied by a p-type or n-type, thereby forming with the respectively n-doped or p-doped regions 520 a heterojunction diode. Consequently, applying a suitable reverse bias over the formed heterojunction diode causes the generation of an electric field respective to first undoped Ge layers 540 and/or second undoped Ge layers 550. Electrical field for electrons is schematically illustrated in by arrow E, whose direction corresponds to regions 520 that are n-doped and Ge/Si layers 570 that are p-doped. The direction of the arrows E schematically indicating the electric fields in the respective pixels would be reversed for regions 520 that are p-doped and Ge/Si layers 570 that are n-doped and the application of a suitable reverse bias.

An impinging X-ray photon will eventually be absorbed in one of first undoped Ge layers 540 and/or second undoped Ge layers 550 and create at least one electron-hole pair. Due to the electric field E electrons and holes will drift in opposite directions along the electric field lines towards regions 520 and metal pads 590, respectively. The electrons collected in regions 520, will then be transferred to substrate 510 constituting the readout unit. The readout unit may include at least one amplifier stage respective to each pixel and may be implemented, for example, with a pulse-sensitive charge amplifier and/or any other analogue and/or digital circuit elements enabling the detection and/or storage and/or transfer of the electrons generated in response to the detection of, e.g., at least one X-ray photon 360. Similar to the previous embodiments, holes can be collected by the readout unit embodied by substrate 510 by corresponding alternation of doping types in X-ray imaging device 500.

A method for manufacturing of X-ray imaging device 500 according to some embodiments of the invention is outlined hereinafter. Substrate 510 may, for example, be doped and dielectric layer 530 may be provided generally across the entire surface of substrate 510.

The method may further include forming interspaces into dielectric layer 530 by, for example, etching dielectric layer 530 such that implanted regions 520 are exposed. Dielectric layer 530 may for example be embodied by $SiO_2$.

After doping and opening of dielectric layer 530, substrate 510 may be suitably pre-cleaned and introduced into the epitaxial deposition chamber. In the deposition chamber, substrate 510 may optionally be subjected to a cleaning step by subjecting the same to, e.g., a hydrogen cleaning step in low-energy plasma. The plasma may be provided by an RF plasma source that is operatively connected to the epitaxial deposition chamber. Alternatively, the cleaning step by, e.g., hydrogen, may be carried out in a separate cleaning chamber. The displacement of substrate 510 from the cleaning chamber to the epitaxial deposition chamber may be accomplished, e.g., as known in the art by, for example, employing a wafer handler.

Upon finalization of the cleaning step, the temperature of substrate 510 may be increased to a value $T_5$ which may take the following values: for example, $200° C. \leqq T_5 \leqq 500° C.$, or for example, $250° C. \leqq T_5 \leqq 350° C.$ After having reached the desired temperature $T_5$ for substrate 510, first undoped Ge layer 540, which may be embodied, for example by undoped Ge, may be provided by, e.g., deposition by employing, for example, a low-energy plasma enhanced chemical vapour deposition process, e.g., as known in the art. First undoped Ge layer 540 may be provided by epitaxial growing thereof only within the interspaces between neighbouring dielectric layers 530, whereas on the top of dielectric layers 530, first undoped Ge layer 540 may be polycrystalline and/or amorphous.

According to some embodiment of the invention, first undoped Ge layer 540 may be provided by growing the same by means of employing precursor gases such as, for example, pure $GeH_4$. However, it should be understood that other gases and or mixtures of gases may be employed as precursor gases such as, for example, Ge-containing gases, and noble gases or hydrogen or any suitable mixture thereof. In some embodiments of the invention, first undoped Ge layer 540 may be grown to a thickness of, for example, about 5 nm-200 nm, or for example, to a thickness of about 10 nm-100 nm. After the growth of first undoped Ge layer 540, a Si cap layer (not shown) may be grown on first undoped Ge layer 540 at the same substrate temperature. The thickness of this cap layer may for example range from 4 nm to 100 nm. The cap layer may help in reducing the growth of islands such as Ge islands in a subsequent annealing step. It is understood, that the Si cap layer may grow epitaxially only above the epitaxial portions of first undoped Ge layer 540 being located above the interspaces between dielectric layers 530, while above on the top of dielectric layers 530 the of the Si cap layer may proceed in a polycrystalline and/or amorphous form.

After growth of first undoped Ge layer 540 (and passivation layer if present), thermal annealing may be performed, wherein the temperature of first undoped Ge layers 540 is raised from $T_5$ to $T_6$. The annealing can be carried out either in the epitaxial deposition chamber or in a separate chamber equipped for rapid thermal annealing (RTA). The separate annealing chamber may be communication with the epitaxial deposition chamber by means of, for example, a wafer handler.

In the absence of the Si cap layer $T_6$ may take the following values in the range of 400° C.$\leq T_6 \leq$600° C. or, for example, about 500° C. Annealing has been shown to be effective in reducing stacking faults in first undoped Ge layer 540, and in forming a network of regularly spaced 90-degree dislocations (not shown) at the interface between first undoped Ge layer 540 and regions 520, thereby possibly relieving misfit strain that may be present at the interface.

It should be noted that in the embodiment wherein first undoped Ge layers 540 are covered by a Si cap, higher annealing temperatures may be permissible. For example, $T_6$ may then take for example, the following values: 600° C.$\leq T_6 \leq$900° C. A rapid thermal annealing step may be used. Subsequently, the Si cap layer may then have to be removed by employing a suitable method such as, for example, a wet chemical etching step.

In any event, it should be noted that in embodiment in which circuitry is subjected to the influence of an annealing step, the step may have to be carried out in ways compatible with the type of circuitry being present on substrate 510, i.e., that the annealing does not damage the circuitry. For example, the annealing of first undoped Ge layers 540 may be performed such that circuitry incorporated in substrate 510 remains undamaged or at least substantially undamaged. In some embodiments for example the annealing step being employed may have to be compatible with CMOS-processed circuitry.

After performing the annealing step, the layers grown thus far may have to be subjected to an intermediate cleaning step, before second undoped Ge layer 550, which is adapted to absorb at least one X-ray photon, is grown.

Second undoped Ge layer 550 may for example be grown at a temperature of, for example, about 450° C. Second undoped Ge layer 550 will in general grow epitaxially only on and possibly in the vicinity of the epitaxial regions of first undoped Ge layer 540. On top of the polycrystalline or amorphous regions above dielectric layers 530, respective second undoped Ge layers 550 are likely to remain in a polycrystalline or amorphous form.

The thickness of second undoped Ge layer 550 is chosen in accordance with the fraction of X-ray photons to be absorbed, while keeping dark currents due to thermal generation processes at acceptable levels for the read-out circuitry. The thickness may be in the range of, for example, 50 μm to 500 μm or, for example, in the range of 50 μm to 300 μm.

In some embodiment of the invention, highly doped Ge/Si layers 570 made of, e.g., Ge may be grown on top of second undoped Ge layer 550, which may be undoped. Epitaxial growth may be finalized by providing at least on top of Ge/Si layers 570 a heavily doped passivation layer (not shown) (e.g., Si layer). The heavily doped passivation layer may have a thickness of a few nanometers such as, for example, 5 nm. The passivation layer may be provided in order to reduce or to eliminate surface recombination.

These doped layers are grown under similar conditions as Ge layer 140, doped Ge layer 150, passivation layer 160 and doped Ge layer 440 and passivation layer 450 as outlined hereinabove.

Figure 5B:
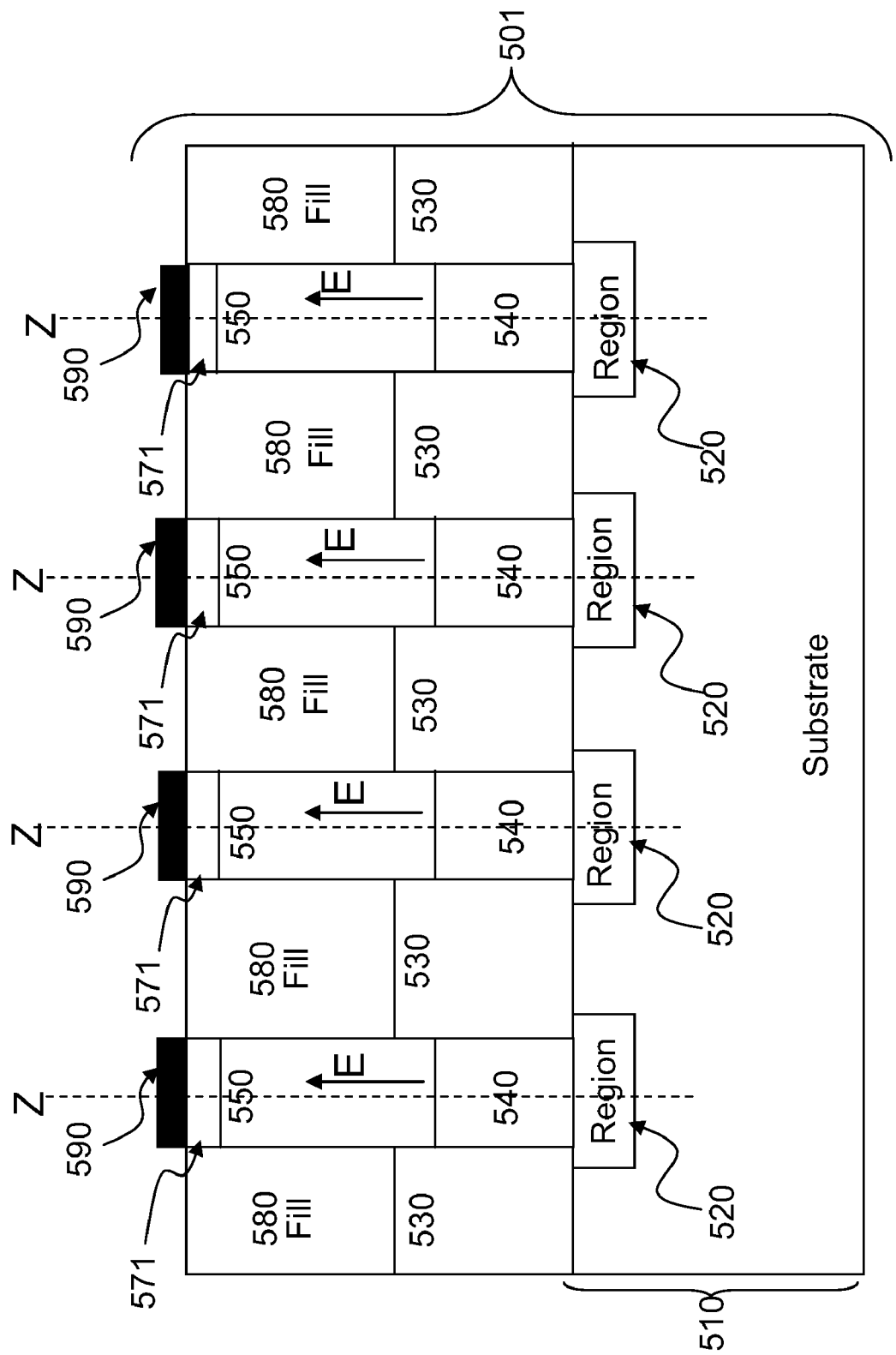
FIG. 5B is a schematic side-view illustration of an X-ray imaging device according to a further embodiment of the invention.

Reference is now made to FIG. 5B. According to some embodiments of the invention, an X-ray imaging device 501 may not have any doped layers above respective second undoped Ge layers 550. Accordingly, X-ray imaging device 501 may herein be referred to as being "layer-less" above respective second undoped Ge layers 550, although passivation layers (not shown) and metallization layers (not shown) may be disposed above second undoped Ge layers 550. In that embodiment, substrate 510 with the layers provided thereon thus far may be unloaded from the epitaxial deposition reactor. Thereafter, doped regions 571 may be selectively provided in the epitaxial parts of second undoped Ge layer 550 above interspaces present between dielectric layers 530, optionally followed by dopant activation by, e.g., rapid thermal annealing. This annealing may be performed such that second undoped Ge layers 550 and optionally first undoped Ge layers 540 remain crack-free. It should be noted that although Ge/Si layers 570 and doped regions 571 are schematically illustrated in an identical manner, these regions have respective differences as outlined hereinabove.

Referring now both to FIG. 5A and FIG. 5B, in some embodiments of the invention, at least some of the polycrystalline and/or amorphous regions of second undoped Ge layers 550 and optionally first undoped Ge layers 540 may be removed, for example, by employing a deep reactive ion etching step, followed by a wet chemical treatment for damage removal and sidewall passivation. The passivation layer may be provided in order to reduce or to eliminate edge leakage current. The remaining structure (not shown) may then be planarized, for example, by filling the gaps between the remaining first undoped Ge layers 540 and optionally second undoped Ge layers 550 with a dielectric material such as, for example filling material 580. Following planarization, Ge/Si layers 570 and doped regions 571 on top of second undoped Ge layer 550, may be provided with metallization 590 by employing methods, e.g., as known in the art.

Figure 5C:
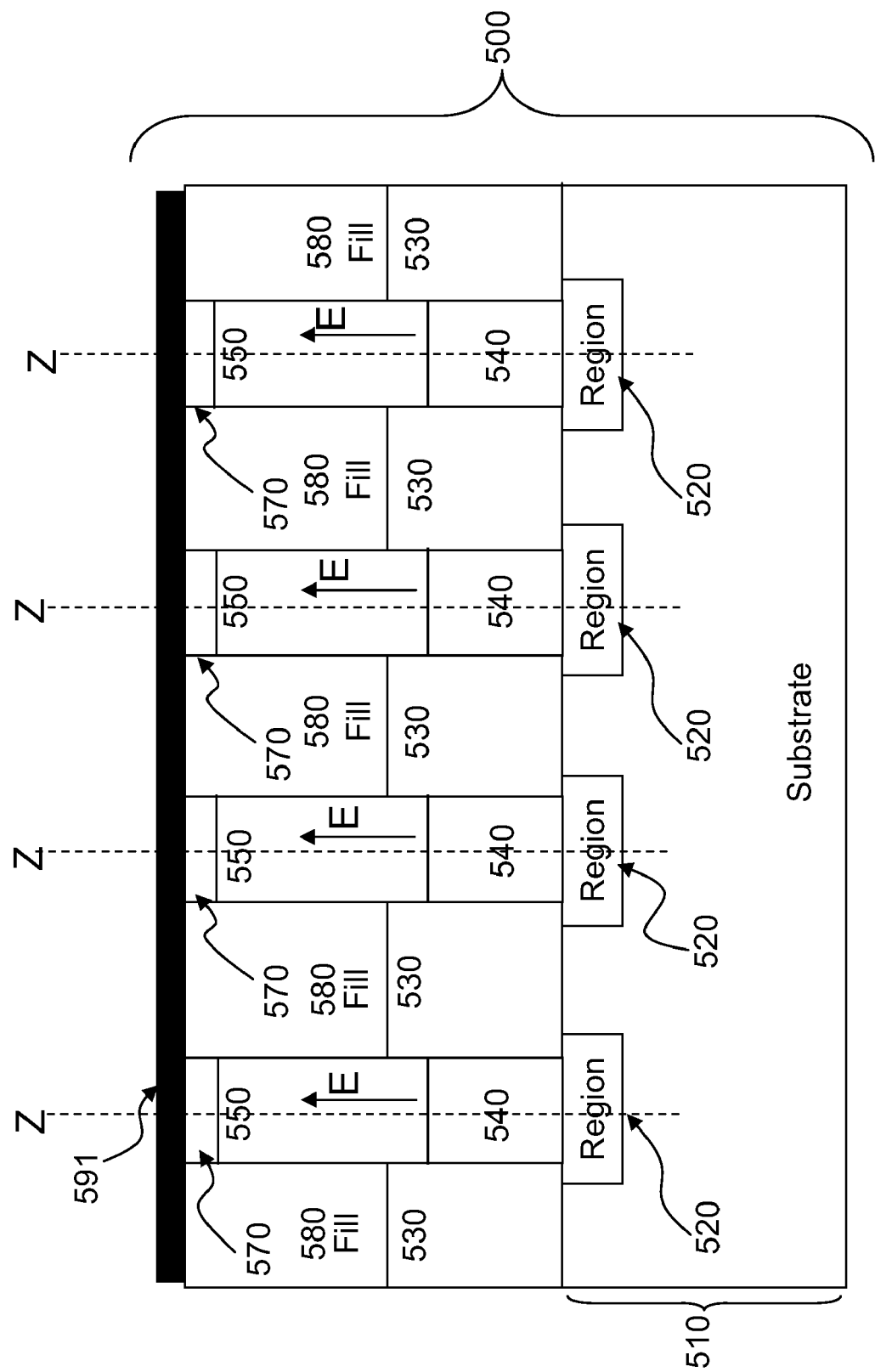
FIG. 5C is a schematic side-view illustration of an X-ray imaging device according to a yet additional embodiment of the invention.
Figure 5D:
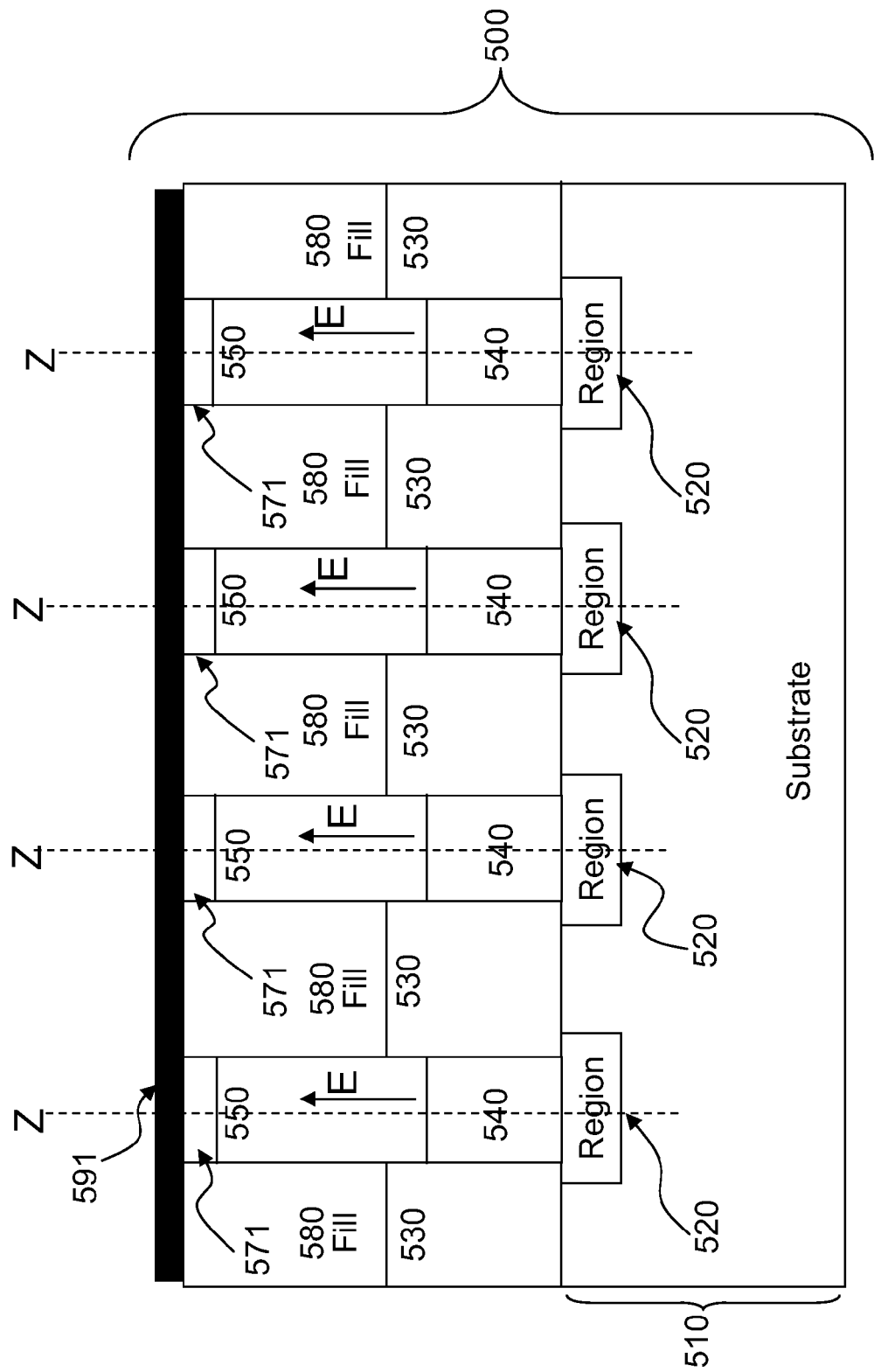
FIG. 5D is a schematic side-view illustration of an X-ray imaging device according to another alternative embodiment of the invention.

It should be noted that in some embodiments of the invention, a continuous metallization pad 591 may be provided, as is schematically illustrated in FIG. 5C and FIG. 5D.

Figure 6:
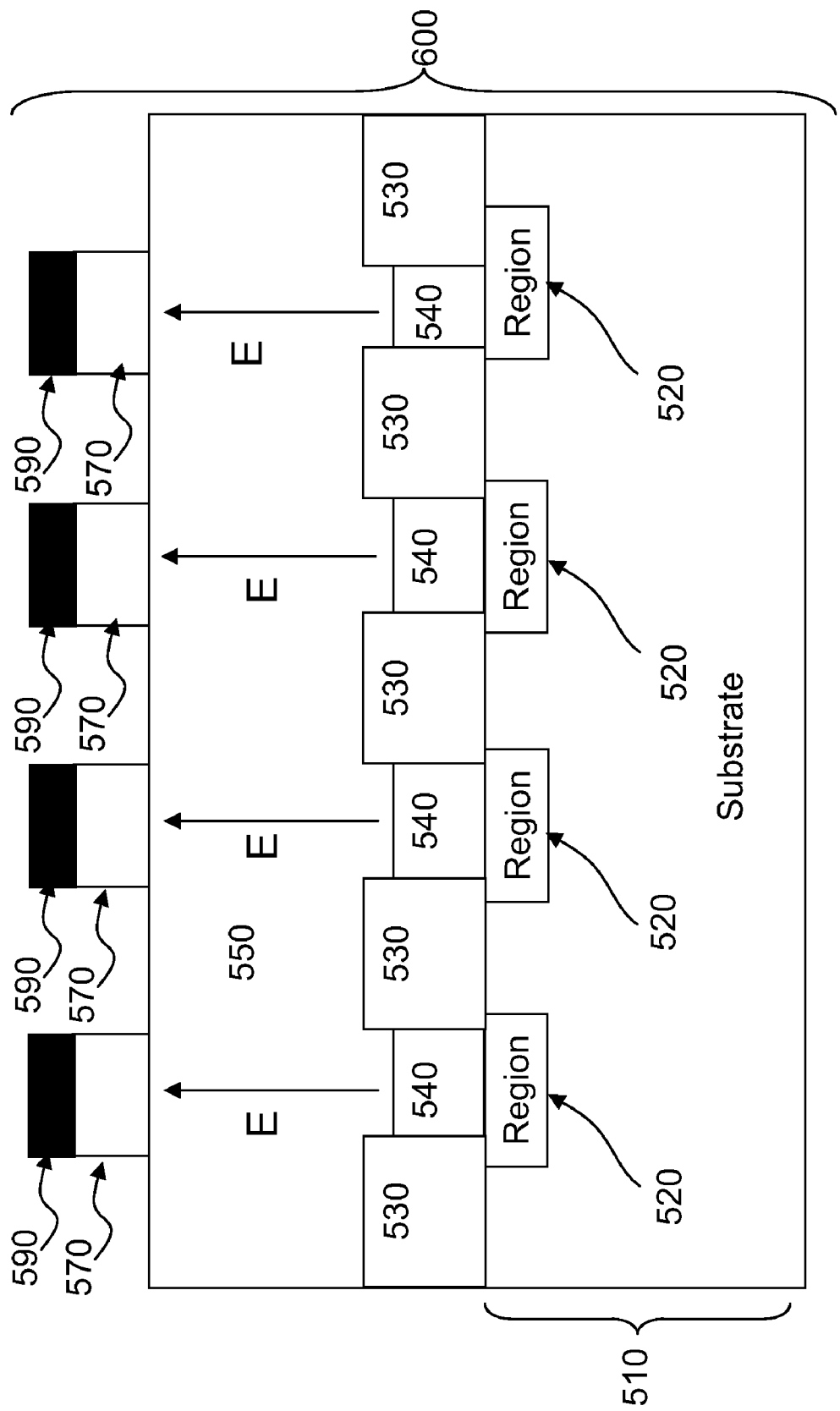
FIG. 6 is a schematic side-view illustration of an X-ray imaging device according to yet another embodiment of the invention.

Reference is now made to FIG. 6. According to some embodiments of the invention, the regions of second undoped Ge layer 550 that are generally above dielectric layers 530 may be kept, i.e., not removed. Correspondingly, at least some of the amorphous and/or polycrystalline regions of second undoped Ge layer 550 may be kept, i.e., not removed, e.g., by an etching step. Consequently, second undoped Ge layer 550 remains substantially continuous and may cover both dielectric layers 530 and first undoped Ge layers 540. When keeping second undoped Ge layer 550 substantially continuous, an additional step for the passivation of grain boundaries and dangling bonds may be employed, such that the leakage current during operation of X-ray imaging device 500 may be reduced or eliminated. In this embodiment, suitable guard-rings (not shown) may be implemented in order to enable a controlled voltage drop towards the scribe edges of the sensor chips, as described in B. J. Baliga, Modern Power Devices, chapter 3, Wiley, New York 1987. This can be done at the chip periphery either on the free Ge surface or on the free silicon surface of an X-ray imaging device 600.

It should be noted that the term "continuous" also encompasses the term "substantially" continuous.

Figure 7:
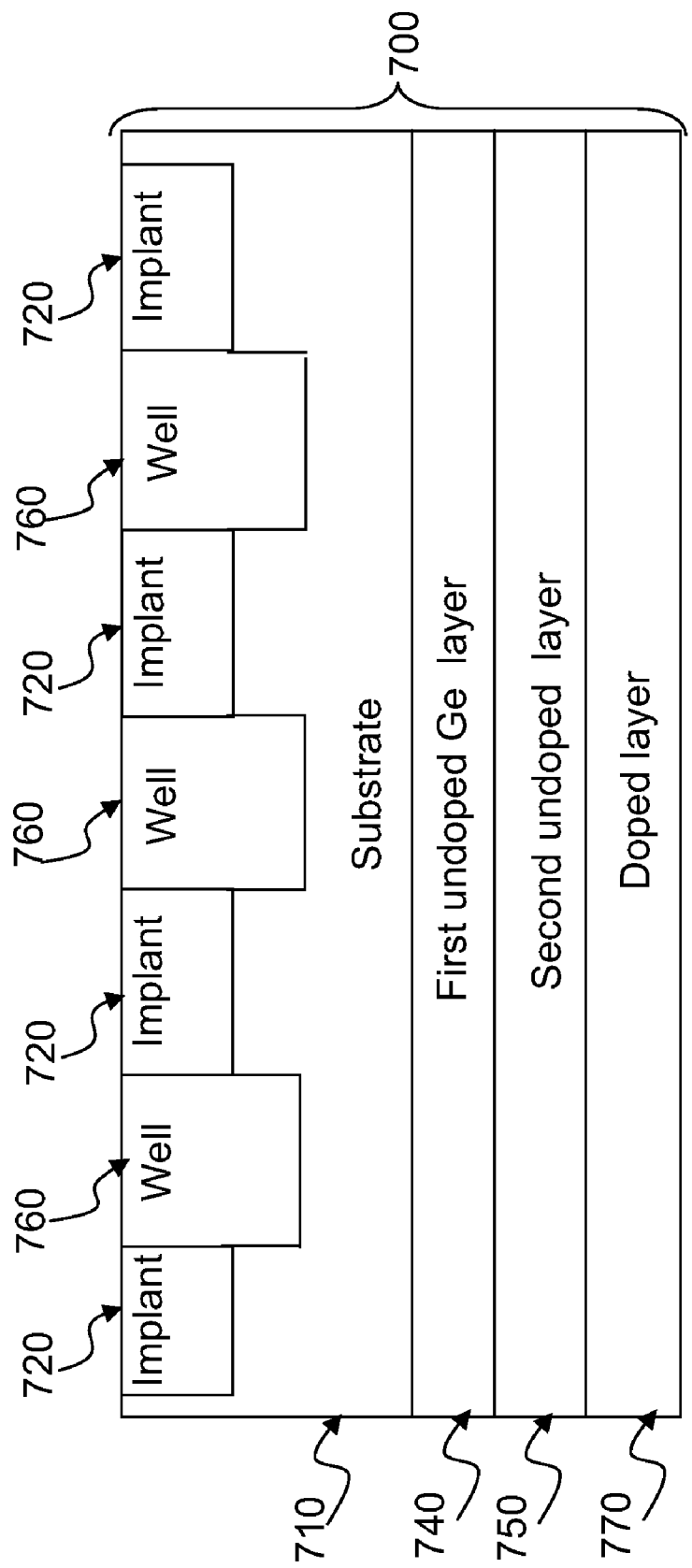
FIG. 7 is a schematic side-view illustration of an X-ray imaging device according to yet another alternative embodiment of the invention.

Reference is now made to FIG. 7. In another embodiment of the invention, first undoped Ge layer 740 and second undoped Ge layer 750 either one or both of which may absorb at least one X-ray photon may be grown on the backside of a pre-processed substrate 710, which may be made of, e.g., Si, and integrally formed thereon or therein readout circuitry processed according to, e.g., CMOS technologies.

Substrate 710 may be made of, for example, low-doped p- or n-semiconductor such as, e.g., silicon of e.g., $<10^{14}$ cm$^{-3}$ dopants and may have a resistivity ρ that may range, for example, from 500 Ω*cm to 15,000 Ω*cm, or, for example, range from 5000 Ω*cm to 15,000 Ω*cm. On one side of substrate 710, to be used for the incorporation of circuitry, a moderately p-doped epitaxial semiconductor (e.g., silicon) layer (not shown) may be grown having a resistivity ranging, for example, from 10 Ω*cm to 1000 Ω*cm and having a thickness ranging from, for example, 5 µm to 50 µm. Alternatively, a deep retrograde well 760 of p-type can be implanted into substrate 710 with a similar resistivity as the aforementioned epitaxial p-layer. Into this epitaxial layer or retrograde well 760 readout circuitry, e.g., as known in the art, may be processed and thus integrally formed, wherein the readout circuitry may employ amplifiers and/or detectors and/or capacitors and/or read-out elements able to readout electrical currents generated in response to the absorption of at least one X-ray photon (not shown).

Implants 720 of e.g., n-type may be provided between wells 760 that are respectively p-doped, implants 720 and doped layer 770 thereby embodying diodes for the collection of the charge carriers generated by the at least one X-ray photon. Implants 720 may further be electrically connected to the circuitry of wells 760 in manner that enables the transfer of at least some of the charges being collected to, e.g., at least one respective amplifier in the respective circuitry.

In some embodiments of the invention, first and second undoped Ge layers 740 and 750, respectively, may be grown on the backside of substrate 710 after the formation of the read-out circuits on the frontside of the substrate, but prior to performing a metallization step. Therefore, the processing of first undoped Ge layer 740 may be enabled and may thus be subjected to rapid thermal annealing steps with fewer constraints on the thermal budget in comparison to the embodiments outlined hereinabove with reference to FIG. 1-FIG. 6.

Accordingly, the conditions chosen for the epitaxial growth of first undoped Ge layer 740 may be chosen to be similar to those used for first undoped Ge layer 420 with reference to FIG. 4 or to those of first undoped Ge layer 540 with reference to FIG. 5. In the embodiment wherein first undoped Ge layer 740 is kept thin and may have thickness ranging for example from 5 nm to 200 nm, a cap (e.g., Si cap) (not shown) prior to the thermal annealing step may be grown thereby possibly preventing first undoped Ge layer 740 from agglomerating. When the cap is used, it has to be removed by, e.g., etching prior to the epitaxial growth of layer 750. The conditions for growing a thick undoped (absorber) layer 750 (made of, e.g., Ge) can be chosen equal or close to the conditions of growth for second undoped Ge layer 550, referenced in FIG. 5. The thickness of layer 750 is chosen in accordance with the fraction of X-ray photons to be absorbed, while keeping dark currents due to thermal generation processes at acceptable levels for the read-out circuitry. The thickness may thus be in the range of, for example, 50 to 500 µm or, for example, in the range of 100 µm to 300 µm.

Subsequently, doped layer 770 (e.g., heavily p-doped Ge) may be grown on layer 750, for example, in-situ, which may be followed by a passivation by, e.g., providing a thin passivation layer (not shown) made of e.g., heavily p-doped thin Si. The passivation layer may be provided in order to reduce or to eliminate surface recombination.

In another variant of this embodiment, X-ray imaging device 700 is unloaded from the epitaxial deposition reactor after growth of the undoped absorber layer 750 and an optional undoped Si cap. In this approach, the epitaxial absorber layer 750 is implanted with doped layer 770, followed by dopant activation by rapid thermal annealing. This approach has the disadvantage of adding a thermal budget which may give rise to cracking of the thick absorber layer 750.

Implants 720 and the read-out circuitry in wells 760 may then be metallised, e.g., as known in the art. Alternatively, first undoped Ge layer 740 and/or second undoped Ge layer 750 may be grown after providing metallization to the CMOS circuitry in wells 760 and passivation steps of substrate 710. In this version the Ge layers may be grown by employing a similar process as described with reference to FIG. 5, notably using the same limited temperature budgets.

By applying a suitable reverse bias voltage over the heterojunction diode formed by a given implant 720 on substrate 710 and respective doped layer 770, an electric field (not shown) will be created at least in first and second layers 740 and 750, respectively. At least one X-ray photon impinging X-ray imaging device 700 will eventually be absorbed in one of first undoped Ge layers 740 or second undoped Ge layers 750 and create at least one electron-hole pair. Due to the electric field E electrons and holes may drift in opposite directions along the electric field lines (not shown) towards at least one implant 720 and the at least one corresponding metallization layer (not shown), respectively. The electrons collected in implants 720 may then be transferred to the circuitry present in the pre-processed substrate 710. This circuitry may comprise of at least one amplifier stage implemented, for example, by a pulse-sensitive charge amplifier; as well as additional or alternative analogue and/or digital circuit elements enabling the detection and/or storage and/or transfer of at least some of the electrons of the at least one electron-hole pair, wherein the electrons may represent information of the absorption of the at least on X-ray photons. It should be noted that each of the at least one implants 720 may constitute a pixel element of x-ray imaging device 700. In this embodiment, suitable guard-rings (not shown) may be employed in order to enable a controlled voltage drop towards the scribe edges (not shown) of X-ray imaging device 700, as described, for example, in B. J. Baliga, "Modern Power Devices", chapter 3, Wiley, New York 1987. This can be done, for example, at the periphery of X-ray imaging device 700, for example, on the free Ge surfaces and/or on the free silicon surface of X-ray imaging device 700.

X-ray imaging device 700 may be manufactured in an ion etching-step free process, since the formation of discrete absorption layers, as for example schematically illustrated with reference to FIG. 5 with discrete first and second undoped Ge layers 540 and 550, respectively, is not necessary. Additionally, X-ray imaging device 700 may be manufactured in a passivation-step free process, as no sidewalls respective to discrete absorption layers are present. Embodiments of X-ray imaging device 700 provide a modification of CMOS processing for rendering the CMOS processes compatible with substrate 710. For example, substrate 710 may be less doped and protection measures may be employed against relatively high electric field of, e.g. >1000 V/cm, in the space charge region of the heterojunction diode.

It should be noted that the doping of layers of X-ray imaging device 700 may be such that in one embodiment electrons are collectable, whereas in another embodiment holes are collected by implants 720.

It should further be noted that at least some of the aforementioned layers (e.g., $Si_{1-y}Ge_y$ layer 130 and/or second undoped Ge layer 430 and/or dielectric layer 530 and/or first undoped Ge layers 740 and/or second undoped Ge layers 750), which are schematically illustrated in respective figures, may alternatively be provided by employing molecular beam epitaxy.

At least some embodiments of the invention enable the manufacturing of an X-ray imaging device that is operable cooler-free. Additionally, the X-ray imaging device is scintillator-free operable and constitutes therefore a direct-conversion X-ray imaging device. Further, according to embodiments of the invention, an X-ray imaging device is manufacturable by employing relatively low temperatures of, e.g., maximal 600° C. such that readout circuitry processed, e.g., according to CMOS technologies, may be integrated and subjected to the same relatively low temperatures during the manufacturing of the X-ray imaging device. In addition, embodiments of the X-ray imaging device may have an ionisation charge created by X-ray photons per unit time at least ten times larger than the charge created by thermal generation processes per unit time. In other words, the signal-to-noise ratio should be such as to guarantee the unambiguous identification of an event caused by photon absorption. In addition, the semiconductor materials being employed for X-ray absorption may be grown as defect-free as possible (e.g., crack-free, misfit free, few threading disclocations). For example, threading dislocations may be, e.g., $<10^7/cm^2$. Moreover, X-ray imaging devices according to embodiments of the invention are adapted to detect, for example, at least 10% of X-ray photons emitted by an X-ray tube. For example, about 10% of X-ray photons emitted by a Tungsten tube operated at about 65 kV may be absorbed already in an about 15 μm thick Ge layer. Furthermore, embodiments of the X-ray imaging device may have conversion efficiency of, for example, at least 340 electron-hole pairs/1 keV of energy of X-ray photons impinging on the pixel elements of the X-ray imaging device.

While the invention has been described with respect to a limited number of embodiments, these should not be construed as limitations on the scope of the invention, but rather as exemplifications of some of the embodiments. Those skilled in the art will envision other possible variations, modifications, and programs that are also within the scope of the invention. Accordingly, the scope of the invention should not be limited by what has thus far been described.

What is claimed is:

1. An X-ray imaging device comprising:
    an X-ray absorber comprising a plurality of semiconductor layers, said plurality of semiconductor layers comprising:
    a silicon substrate having a backside, wherein a CMOS-processed readout unit is integrally formed with said silicon substrate;
    and at least one absorption layer adapted to absorb at least one X-ray photon impinging on said at least one absorption layer that is adapted to correspondingly generate in response to said at least one impinging X-ray photon at least one electron-hole pair, wherein said at least one absorption layer comprises an epitaxial $Si_{1-x}Ge_x$ layer, and wherein $0 \leq x \leq 1$;
    wherein said CMOS-processed readout unit is operatively coupled with said at least one absorption layer such to enable readout of said at least one electron-hole pair.

2. The X-ray imaging device of claim 1, wherein
    an $Si_{1-y}Ge_y$ layer is provided on said $Si_{1-x}Ge_x$ layer, wherein $x_f \leq y \leq 1$, and
    a Ge layer is provided on said $Si_{1-y}Ge_y$ layer, wherein said Ge layer is integrally formed with either one of the following:
    discrete doped Ge layers and doped regions, wherein said discrete doped Ge layers and said doped regions have at least one metal pad provided thereon.

3. The X-ray imaging device of claim 2, wherein said Ge layer has a thickness ranging from 50 μm to 500 μm.

4. The X-ray imaging device of claim 2, wherein integrally formed CMOS-processed said readout unit comprises:
    a chip comprising circuitry, wherein said chip is operatively coupled to said at least one metal pad; and
    a metallization layer provided on said backside of said silicon substrate, wherein applying a first reverse bias voltage on said metallization layer generates an electric field such that said at least one electron-hole pair is separated and either the electron or the hole of said at least one electron-hole pair drifts to said at least one metal pad and said circuitry for readout.

5. The X-ray imaging device of claim 1, said at least one absorption layer comprising:
    at least one first undoped Ge layer;
    and at least one second undoped Ge layer on said at least one first undoped Ge layer;
    wherein said at least one first undoped Ge layer has a thickness ranging from 0.5 μm to 1 μm, and wherein said at least one second undoped Ge layer has a thickness ranging from 50 μm to 500 μm.

6. The X-ray imaging device of claim 5, wherein said integrally formed, CMOS-processed readout unit comprises at least one doped region, and wherein said X-ray imaging device further comprises:
    a patterned protective dielectric layer transversely disposed between said at least one first undoped Ge and said silicon substrate;
    and either one of the following:
    doped regions in said at least one second undoped Ge layer, and Ge/Si layer above said second undoped Ge layer, wherein both said doped regions and said Ge/Si layers have provided thereon said at least one metal pad thereby forming a heterojunction diode;
    and wherein applying a second reverse bias voltage over said heterojunction diode causes the generation of another electric field along said first and second undoped Ge layers, thereby enabling the readout of said at least one electron-hole pair by said readout unit.

7. The X-ray imaging device of claim 5,
    wherein said first and said second undoped Ge layers are provided on the backside of said silicon substrate;
    wherein at least one implant and at least one well are integrally formed with said silicon substrate in an alternating manner to embody diodes for the collection of charge carriers generated in response to said at least one X-ray photon;
    wherein said circuitry is integrally formed with said at least one well; and
    wherein said implants are electrically connected to said circuitry enabling the detection of said at least one electron-hole pair.

8. A method for manufacturing an X-ray imaging device, said method comprising:
    providing a plurality of semiconductor layers comprising:
    a silicon substrate having a backside, wherein a CMOS-processed readout unit is integrally formed with said silicon substrate; and
    at least one absorption layer adapted to absorb at least one X-ray photon impinging on said at least one absorption layer that is adapted to correspondingly generate in response to said at least one impinging X-ray photon at least one electron-hole pair wherein said at least one absorption layer comprises an epitaxial $Si_{1-x}Ge_x$ absorption layer; and wherein $0 \leq x \leq 1$;
    wherein said CMOS-processed readout unit is operatively coupled with said at least one absorption layer to enable readout of said at least one electron-hole pair.

9. The method of claim 8 wherein providing said plurality of semiconductor layers comprises:
    providing an $Si_{1-y}Ge_y$ layer on said $Si_{1-x}Ge_x$ layer, wherein $x_f \leq y \leq 1$; and providing a Ge layer on said $Si_{1-y}Ge_y$ layer, wherein said Ge layer is integrally formed with either one of the following:
discrete doped Ge layers and doped regions having at least one metal pad provided thereon.

10. The method of claim 9, wherein said Ge layer has a thickness ranging from 50 μm to 500 Mm.

11. The method of claim 9 further comprising:
processing a chip to comprise circuitry, wherein said chip is comprised in said CMOS-processed readout unit that is integrally formed with said silicon substrate;
operatively coupling said chip to said at least one metal pad;
providing metallization layer said backside of said silicon substrate, wherein by applying a first reverse bias voltage on said metallization layer an electric field is generated causing the drifting of either one of the following:
an electron and hole of said at least one electron-hole pair to said circuitry for readout.

12. The method of claim 8 wherein providing said at least one absorption layer comprises:
providing at least one first undoped Ge layer on said at least one epitaxial $Si_{1-x}Ge_x$ layer; and
providing at least one second undoped Ge layer on said first undoped Ge layer;
wherein said first undoped Ge layer has a thickness ranging from 0.5 μm to 1 μm, and wherein said second undoped Ge layer has a thickness ranging from 50 μm to 500 Mm.

13. The method of claim 12, wherein said first and said second undoped Ge layer are provided above said silicon substrate.

14. The method of claim 12 further comprising:
providing a patterned protective dielectric layer in a transversely disposed manner between said at least one first undoped Ge and said silicon substrate;
providing either one of the following:
doped regions in said second undoped Ge layer, and Ge/Si layer above said second undoped Ge layer;
and providing on both said doped regions and said Ge/Si layers at least one metal pad thereby forming a heterojunction diode, wherein applying a second reverse bias voltage over said heterojunction diode causes the generation of an electric field along said first and second undoped Ge layers, thereby enabling the readout of said at least one electron-hole pair by said readout unit.

15. The method of claim 12, comprising:
providing said first and said second undoped Ge layers on said backside;
integrally forming with said silicon substrate in an alternating manner at least one implant and at least one well to embody diodes for the collection of charge carriers generated said at least one X-ray photon;
integrally forming readout circuitry in said at least one well;
and electrically connecting said implants to said readout circuitry to enable the detection of said at least one electron-hole pair.

* * * * *